United States Patent
Chindo et al.

(10) Patent No.: US 9,048,853 B2
(45) Date of Patent: Jun. 2, 2015

(54) ATOM CELL MODULE, QUANTUM INTERFERENCE DEVICE, ELECTRONIC APPARATUS, AND ATOM CELL MAGNETIC FIELD CONTROL METHOD

(71) Applicant: Seiko Epson Corporation, Tokyo (JP)

(72) Inventors: Koji Chindo, Suwa (JP); Hiroyuki Yoshida, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/016,467

(22) Filed: Sep. 3, 2013

(65) Prior Publication Data
US 2014/0070894 A1 Mar. 13, 2014

(30) Foreign Application Priority Data
Sep. 10, 2012 (JP) ................................. 2012-198264

(51) Int. Cl.
| H03L 7/26 | (2006.01) |
| H03B 17/00 | (2006.01) |
| G04F 5/14 | (2006.01) |

(52) U.S. Cl.
CPC ............ *H03L 7/26* (2013.01); *H03B 17/00* (2013.01); *G04F 5/145* (2013.01)

(58) Field of Classification Search
CPC ........... G04F 5/14; G04F 5/145; H03B 17/00; H03L 7/26
USPC .............................. 331/3, 65–67, 70, 94.1, 176
See application file for complete search history.

(56) References Cited

U.S. PATENT DOCUMENTS

| 5,387,881 | A | * | 2/1995 | Schweda et al. ............. 331/94.1 |
| 5,670,914 | A | * | 9/1997 | Liberman et al. ............ 331/94.1 |
| 5,712,597 | A | * | 1/1998 | Atsumi et al. ............... 331/94.1 |
| 6,265,945 | B1 | * | 7/2001 | Delaney et al. ................... 331/3 |
| 6,320,472 | B1 | | 11/2001 | Vanier |
| 6,812,800 | B2 | * | 11/2004 | Matsuura et al. ............ 331/94.1 |
| 7,215,213 | B2 | * | 5/2007 | Mescher et al. ............. 331/94.1 |
| 7,468,637 | B2 | * | 12/2008 | Braun et al. ................. 331/94.1 |
| 8,319,156 | B2 | * | 11/2012 | Borwick et al. .............. 219/482 |
| 8,614,605 | B2 | * | 12/2013 | Chindo ........................ 331/94.1 |
| 8,633,773 | B2 | * | 1/2014 | Chindo ........................ 331/94.1 |
| 2009/0315629 | A1 | | 12/2009 | Chindo et al. |
| 2012/0235753 | A1 | | 9/2012 | Nishida |
| 2012/0235755 | A1 | | 9/2012 | Chindo |
| 2013/0027142 | A1 | | 1/2013 | Chindo |

FOREIGN PATENT DOCUMENTS

| JP | 2010-028794 A | 2/2010 |
| JP | 2010-147367 A | 7/2010 |
| JP | 2010-147967 A | 7/2010 |
| JP | 2010-287937 A | 12/2010 |
| JP | 2012-191121 A | 10/2012 |
| JP | 2012-191582 A | 10/2012 |
| JP | 2013-030513 A | 2/2013 |

* cited by examiner

*Primary Examiner* — Levi Gannon
(74) *Attorney, Agent, or Firm* — Harness, Dickey & Pierce, P.L.C.

(57) ABSTRACT

An atom cell module includes an atom cell in which atoms are enclosed, a heating unit that heats the atom cell by generating heat when a current flows, and a magnetic field generator that generates a magnetic field inside the atom cell. A magnetic field at a predetermined position inside the atom cell generated by the magnetic field generator includes a magnetic field component in an opposite direction to a magnetic field at the predetermined position generated on the basis of a current flowing through the heating unit.

16 Claims, 22 Drawing Sheets

ATOM CELL MODULE, QUANTUM INTERFERENCE DEVICE, ELECTRONIC APPARATUS, AND ATOM CELL MAGNETIC FIELD CONTROL METHOD

BACKGROUND

1. Technical Field

The present invention relates to an atom cell module, a quantum interference device, an electronic apparatus, and an atom cell magnetic field control method.

2. Related Art

It is known that the cesium atom, which is a kind of an alkali metal atom, has a ground level of $6S_{1/2}$ and two excitation levels of $6P_{1/2}$ and $6P_{3/2}$, as shown in FIG. 20. In addition, each level of $6S_{1/2}$, $6P_{1/2}$, and $6P_{2/3}$ has a hyperfine structure split into a plurality of energy levels. Specifically, $6S_{1/2}$ has two ground levels of F=3 and 4, $6P_{1/2}$ has two excitation levels of F=3 and 4, and $6P_{3/2}$ has four excitation levels of F=2, 3, 4, and 5.

For example, a cesium atom in the ground level of F=3 of $6S_{1/2}$ can transition to the excitation level of any of F=2, F=3, and F=4 of $6P_{3/2}$ by absorbing the D2 beam, but cannot transition to the excitation level of F=5. A cesium atom in the ground level of F=4 of $6S_{1/2}$ can transition to the excitation level of any of F=3, F=4, and F=5 of $6P_{3/2}$ by absorbing the D2 beam, but cannot transition to the excitation level of F=2. These transitions are based on the transition selection rule when an electric dipole transition is assumed. On the contrary, a cesium atom in the excitation level of one of F=3 and F=4 of $6P_{3/2}$ can transition to the ground level (either the original ground level or the other ground level) of F=3 or F=4 of $6S_{1/2}$ by emitting the D2 beam. Here, in the case of three levels (two ground levels and one excitation level) of two ground levels of F=3 and 4 of $6S_{1/2}$ and one of the excitation levels of F=3 and 4 of $6P_{3/2}$, Λ-type transition according to absorption and emission of the D2 beam is possible. Accordingly, these three levels are called Λ-type three levels. Similarly, in the case of three levels of two ground levels of F=3 and 4 of $6S_{1/2}$ and one of the excitation levels of F=3 and 4 of $6P_{1/2}$, Λ-type transition according to absorption and emission of the D1 beam is possible. Accordingly, these three levels form Λ-type three levels.

On the other hand, a cesium atom in the excitation level of F=2 of $6P_{3/2}$ always transitions to the ground level (original ground level) of F=3 of $6S_{1/2}$ by emitting the D2 beam. Similarly, a cesium atom in the excitation level of F=5 of $6P_{3/2}$ always transitions to the ground level (original ground level) of F=4 of $6S_{1/2}$ by emitting the D2 beam. That is, in the case of three levels of two ground levels of F=3 and 4 of $6S_{1/2}$ and one excitation level of F=2 or 5 of $6P_{3/2}$, Λ-type transition according to absorption and emission of the D2 beam is not possible. Accordingly, these three levels do not form Λ-type three levels. In addition, it is known that alkali metal atoms other than the cesium atom similarly have two ground levels and one excitation level that form Λ-type three levels.

Incidentally, when resonance light (assumed to be resonance light 1) having a frequency (oscillation frequency) equivalent to the energy difference between the first ground level (in the case of a cesium atom, the ground level of F=3 of $6S_{1/2}$) and the excitation level (in the case of a cesium atom, for example, the excitation level of F=4 of $6P_{3/2}$), which form the Λ-type three levels, and resonance light (assumed to be resonance light 2) having a frequency (oscillation frequency) equivalent to the energy difference between the second ground level (in the case of a cesium atom, the ground level of F=4 of $6S_{1/2}$) and the excitation level are simultaneously emitted to a gaseous alkali metal atom, a change to a superposition state of the two ground levels, that is, a quantum coherence state (dark state) is made. As a result, excitation to the excitation level is stopped. This is an electromagnetically induced transparency (EIT) phenomenon (called coherent population trapping (CPT) in some cases). The frequency difference between the resonance light pair (resonance light 1 and resonance light 2) that causes the EIT phenomenon exactly matches a frequency equivalent to the energy difference $\Delta E_{12}$ between two ground levels of an alkali metal atom. For example, in the case of a cesium atom, the frequency equivalent to the energy difference between the two ground levels is 9.192631770 GHz. Accordingly, the EIT phenomenon occurs when two types of laser beams of D1 and D2 beams having a frequency difference of 9.192631770 GHz are simultaneously emitted to the cesium atom.

Therefore, as shown in FIG. 21, when light with a frequency of $f_1$ and light with a frequency of $f_2$ are simultaneously emitted to a gaseous alkali metal atom, the two light waves become a resonance light pair. Depending on whether or not the alkali metal atom causes the EIT phenomenon, the intensity of light transmitted through the alkali metal atom is steeply changed. A signal indicating the intensity of the transmitted light that is steeply changed is called an EIT signal (resonance signal). When the frequency difference $f_1-f_2$ of the resonance light pair exactly matches a frequency $f_{12}$ equivalent to $\Delta E_{12}$, the level of the EIT signal indicates a peak value. Therefore, a highly accurate oscillator can be realized by emitting two light waves to an atom cell (gas cell), in which gaseous alkali metal atoms are enclosed, and performing control such that the peak of the EIT signal is detected by a photodetector, that is, such that the frequency difference $f_1-f_2$ between the two light waves exactly matches the frequency $f_{12}$ equivalent to $\Delta E_{12}$. For example, a technique relevant to such an atom oscillator is disclosed in U.S. Pat. No. 6,320,472.

Incidentally, when a magnetic field is applied to the alkali metal atom, each energy level undergoes Zeeman splitting. For example, as shown in FIG. 22A, in the case of a cesium atom, the ground level of F=3 of $6S_{1/2}$ or the excitation level of F=3 of $6P_{3/2}$ is split into seven levels corresponding to the magnetic quantum number mF=0, ±1, ±2, and ±3, and the ground level of F=4 of $6S_{1/2}$ or the excitation level of F=4 of $6P_{3/2}$ is split into nine levels corresponding to the magnetic quantum number mF=0, ±1, ±2, ±3, and ±4. In addition, the alkali metal atom causes the EIT phenomenon with two light waves, which have a frequency difference equivalent to an energy difference (frequency difference) between the Zeeman levels with the same magnetic quantum number mF at two ground levels, as a resonance light pair. That is, in a state where the magnetic field is applied to the alkali metal atom, a plurality of peaks are observed in the intensity of light transmitted through the alkali metal atom, that is, a plurality of EIT signals are observed if a frequency difference between two light waves is swept. For example, as shown in FIG. 22B, in the case of a cesium atom, seven EIT signals corresponding to the magnetic quantum number mF=0, ±1, ±2, and ±3 are observed. In general, as shown in FIG. 22B, the strength of the EIT signal corresponding to mF=0 is highest. For this reason, in many atom oscillators, a uniform steady magnetic field is applied to the gas cell, and the frequency difference between the resonance light pair is controlled so as to generate an EIT signal corresponding to mF=0. However, if the size of the atom oscillator is reduced, the volume around the gas cell is reduced. Accordingly, it is difficult to apply a stable magnetic field to the gas cell. In addition, since a certain degree of temperature is needed for the gas cell, a heater is provided. In this case, however, since a heater current is changed according to the changes in the outside air temperature, a magnetic field generated by the heater current is also changed. As a result, a magnetic field applied to the gas cell is changed by the changes in the outside air temperature. Then, as shown in FIG. 23, since the energy difference (frequency difference) between the Zeeman levels with the same magnetic quantum number mF at two ground levels changes quadratically with respect to variations of the magnetic field, a problem occurs in that the frequency stability (in particular, temperature characteristic) of the atom oscillator is degraded. In addition, if the size of the atom oscillator is reduced, the gas cell is reduced. In this case, since the total amount of atoms causing the EIT phenomenon is reduced, there is also a problem in that the strength of the EIT signal is reduced.

SUMMARY

An advantage of some aspects of the invention is to provide an atom cell module and an atom cell magnetic field control method capable of reducing the frequency variation range of resonance light with respect to the atoms by canceling at least apart of the magnetic field generated inside the atom cell and provide a quantum interference device and an electronic apparatus with high frequency stability using the atom cell module.

The invention can be implemented as the following forms or application examples.

Application Example 1

This application example is directed to an atom cell module including: an atom cell in which atoms are enclosed; a heating unit that heats the atom cell by generating heat when a current flows; and a magnetic field generator that generates a magnetic field. Inside the atom cell, a magnetic field generated by the magnetic field generator and a magnetic field generated by a current flowing through the heating unit include magnetic field components in opposite directions.

A magnetic field at a predetermined position on the optical path inside the atom cell generated by the magnetic field generator may have the same strength as a magnetic field at the predetermined position, which is generated on the basis of a current flowing through the heating unit, in the opposite direction.

In the atom cell module according to this application example, at least apart of the magnetic field generated inside the atom cell on the basis of the current flowing through the heating unit can be canceled by the magnetic field generated by the magnetic field generator. Therefore, it is possible to further reduce the range of a variation in the strength of the magnetic field inside the atom cell caused by the changes in the current flowing through the heating unit. As a result, it is possible to further reduce the frequency variation range of the resonance light with respect to the atoms enclosed in the atom cell.

Application Example 2

The atom cell module according to the above-described application example may be configured such that the magnetic field generator generates a magnetic field inside the atom cell when at least apart of the current flowing through the heating unit flows.

In the atom cell module according to this application example, even if the current flowing through the heating unit is changed, a magnetic field generated by the magnetic field generator is also changed in response to the change. As a result, at least a part of the magnetic field generated on the basis of the current flowing through the heating unit can be effectively canceled.

Application Example 3

The atom cell module according to the above-described application example may be configured to further include a magnetic shielding unit that shields the atom cell, the heating unit, and the magnetic field generator from an external magnetic field.

In the atom cell module according to this application example, it is possible to suppress an increase in the frequency variation range of resonance light due to the influence of the external magnetic field on the atom cell module.

Application Example 4

This application example is directed to a quantum interference device including: the atom cell module according to any one of the atom cell modules described above; a light generator that generates light including a resonance light pair and emits the light to the atom cell; a light detector that detects light transmitted through the atom cell; and a control unit that controls a frequency of the resonance light on the basis of a detection signal of the light detector.

In the quantum interference device according to this application example, a degenerate EIT signal with high signal strength can be generated as a detection signal of the light detector by using the atom cell module in which the frequency variation range of the resonance light with respect to the atom is further reduced. Therefore, a quantum interference device with high frequency stability can be realized by performing feedback control so as to be locked to the degenerate EIT signal.

Application Example 5

The quantum interference device according to the above-described application example may be configured to further include a magnetic field control unit that controls a magnetic field generated by the magnetic field generator so as to reduce a variation of a magnetic field inside the atom cell.

In the quantum interference device according to this application example, even if the current flowing through the heating unit is changed, it is possible to stably generate an EIT signal with high signal strength that has degenerated due to reducing the variation of the magnetic field inside the atom cell.

Application Example 6

The quantum interference device according to the above-described application example may be configured such that the quantum interference device further includes a magnetic detector that detects a strength of a magnetic field generated by a current flowing through the heating unit, and the magnetic field control unit controls a magnetic field generated by the magnetic field generator according to a detection signal of the magnetic detector.

In the quantum interference device according to this application example, even if the magnetic field strength is changed due to the changes in the current flowing through the heating unit, it is possible to detect the change in the strength of the magnetic field using the magnetic detector and reduce the variation of the magnetic field inside the atom cell according to the detection result. As a result, it is possible to stably generate a degenerate EIT signal with high signal strength.

In addition, in the quantum interference device according to this application example, since the magnetic detector also detects a magnetic field caused by the external magnetic field of the atom cell module, it is possible to stably generate a degenerate EIT signal with high signal strength even if the external magnetic field is changed.

Application Example 7

The quantum interference device according to the above-described application example may be configured such that the magnetic detector is adjacent to the heating unit.

In the quantum interference device according to this application example, the magnetic detector is disposed so as to be adjacent to the heating unit whose temperature is kept almost constant. Therefore, it is possible to realize high frequency stability even if the temperature characteristic of the magnetic detector is not corrected.

Application Example 8

The quantum interference device according to the above-described application example may be configured such that the quantum interference device further includes a current detector that detects a current flowing through the heating unit, and the magnetic field control unit controls a magnetic field generated by the magnetic field generator according to a detection signal of the current detector.

In the quantum interference device according to this application example, even if the magnetic field strength is changed due to the changes in the current flowing through the heating unit, it is possible to detect the current flowing through the heating unit using the current detector and reduce the variation of the magnetic field inside the atom cell according to the detection result. As a result, it is possible to stably generate a degenerate EIT signal with high signal strength.

Application Example 9

This application example is directed to an electronic apparatus including any one of the quantum interference devices described above.

Application Example 10

This application example is directed to an atom cell magnetic field control method to control a magnetic field inside an atom cell in which atoms are enclosed. The atom cell magnetic field control method includes generating a magnetic field including a magnetic field component in an opposite direction to a magnetic field inside the atom cell generated on the basis of a current flowing through a heating unit that heats the atom cell.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the accompanying drawings. In addition, the embodiments described below are not intended to limit the contents of the invention defined by the appended claims. In addition, all of the configurations described below are not necessarily essential components of the invention.

Hereinafter, an atom oscillator that is an example of a quantum interference device will be described as an example.

1. ATOM OSCILLATOR

1-1. First Embodiment

Functional Configuration of an Atom Oscillator

Figure 1:
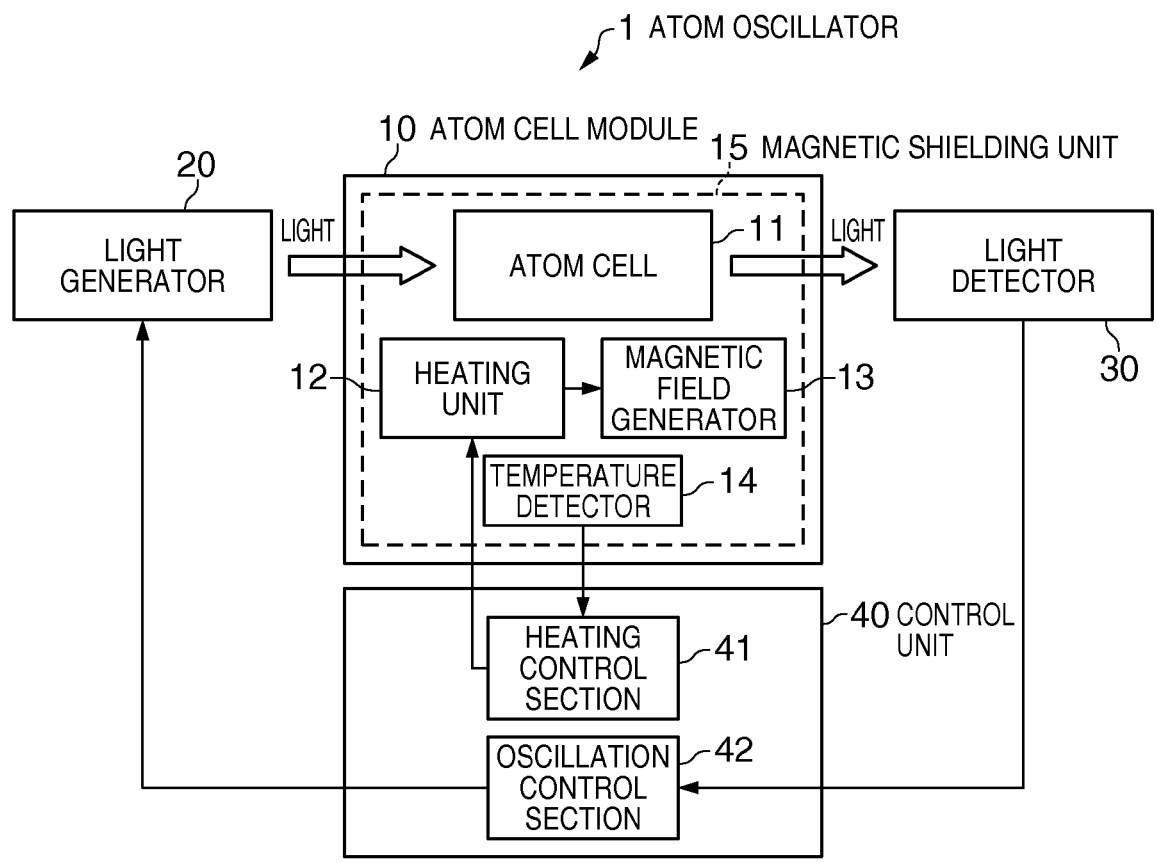
FIG. 1 is a functional block diagram of an atom oscillator of a first embodiment.

FIG. 1 is a functional block diagram of an atom oscillator of a first embodiment. As shown in FIG. 1, an atom oscillator 1 of the first embodiment is configured to include an atom cell module 10, a light generator 20, a light detector 30, and a control unit 40. In addition, the atom oscillator of the present embodiment may be formed by appropriately omitting or changing some constituent components (units) shown in FIG. 1 or by appropriately adding other constituent components.

The atom cell module 10 is configured to include an atom cell 11, a heating unit 12, a magnetic field generator 13, and a temperature detector 14. The atom cell module 10 may further include a magnetic shielding unit 15.

The atom cell 11 is formed by filling a container formed of a transparent material, such as glass, with atoms having Λ-type three levels (for example, alkali metal atoms, such as sodium (Na) atoms, rubidium (Rb) atoms, and cesium (Cs) atoms). Light generated by the light generator 20 is incident on the atom cell 11, and the incident light is transmitted through the atom cell 11.

The heating unit 12 generates heat when a current flows therethrough, thereby heating the atom cell 11. For example, the heating unit 12 can be realized by a heater that generates heat corresponding to the amount of current. For example, a heater having conductivity and optical transparency may be disposed on the light incidence surface and the light emission surface of the atom cell 11. Such a heater having conductivity and optical transparency can be realized using a transparent electrode material, such as an indium tin oxide (ITO), an indium zinc oxide (IZO), $In_3O_3$, $SnO_2$, Sb-containing $SnO_2$, and Al-containing ZnO.

The magnetic field generator 13 generates a magnetic field inside the atom cell 11. In particular, in the present embodiment, the magnetic field generator 13 generates a magnetic field inside the atom cell 11 when at least a part of current flowing through the heating unit 12 flows through the magnetic field generator 13. A magnetic field at a predetermined position inside the atom cell 11 generated by the magnetic field generator 13 (for example, a position on the optical path inside the atom cell 11) includes a magnetic field component in an opposite direction to a magnetic field at the predetermined position generated on the basis of the current flowing through the heating unit 12. For example, such a magnetic field generator 13 can be realized by a coil wound around a part of the power supply line of the heating unit 12. The direction or the magnitude of the magnetic field at a predetermined position inside the atom cell 11 can be adjusted by changing the position or the shape of the coil (for example, the number of turns or the diameter of the coil), the direction of current flowing through the coil (or the direction of winding of the coil), or the magnitude of current. For example, it is possible to perform adjustment such that the magnetic field generated by the heating unit 12 and the magnetic field generated by the magnetic field generator 13 cancel each other out (such that the magnetic field strength becomes close to 0) at a predetermined position on the optical path inside the atom cell 11.

The temperature detector 14 is disposed at a predetermined position, and detects the temperature. For example, the temperature detector 14 may be disposed adjacent to the heating unit 12 or the atom cell 11. For example, the temperature detector 14 can be realized by a temperature sensor, such as a thermistor or a thermocouple.

The magnetic shielding unit 15 may shield at least the atom cell 11, the heating unit 12, and the magnetic field generator 13 from an external magnetic field, and may further shield the temperature detector 14 from an external magnetic field.

The light generator 20 generates light including resonance light to resonate atoms enclosed in the atom cell 11 and emits the light to the atom cell 11. For example, the light generator 20 can be realized by a semiconductor laser. As a semiconductor laser, a surface emitting laser, such as an edge emitting laser or a vertical cavity surface emitting laser (VCSEL), can be used.

The light detector 30 detects light transmitted through the atom cell 11. For example, the light detector 30 can be realized using a photodiode (PD) that outputs a detection signal corresponding to the intensity of received light.

The control unit 40 is configured to include a heating control section 41 and an oscillation control section 42, and can be realized by a general-purpose microprocessor or a dedicated circuit, for example.

The heating control section 41 controls a current flowing through the heating unit 12 according to the detection signal of the temperature detector 14. The amount of heat generation of the heating unit 12 is controlled by the heating control section 41 so that the internal temperature of the atom cell 11 is kept almost constant.

The oscillation control section 42 controls the frequency of light generated by the light generator 20 on the basis of the detection signal of the light detector 30. By the oscillation control section 42, the light generator 20 is controlled so as to generate resonance light.

In addition, as such an atom oscillator, for example, it is possible to adopt a configuration in which the light generator 20 is controlled so as to generate a resonance light pair causing the EIT phenomenon in the atoms enclosed in the atom cell 11, or it is possible to adopt a configuration in which the atom cell 11 is housed in a cavity resonator (microwave cavity), the light generator 20 is controlled so as to generate resonance light for the atoms enclosed in the atom cell 11, and an optical micro double resonance phenomenon occurring due to applying a microwave to the cavity resonator is used.

Specific Configuration of the Atom Oscillator

Figure 2:
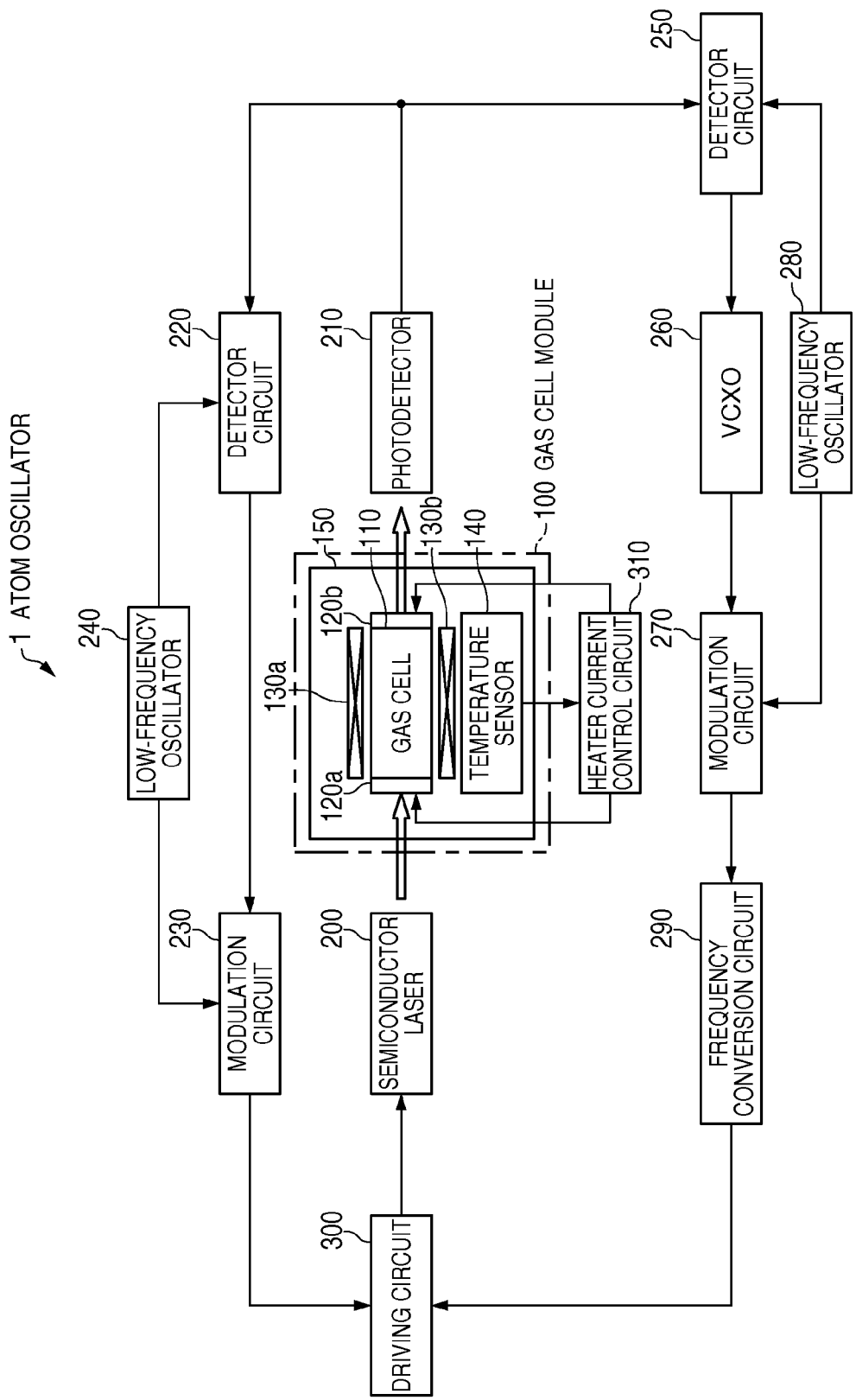
FIG. 2 is a diagram showing an example of the specific configuration of the atom oscillator of the first embodiment.

FIG. 2 is a diagram showing an example of the specific configuration of the atom oscillator 1 of the first embodiment. As shown in FIG. 2, the atom oscillator 1 is configured to include a gas cell module 100, a semiconductor laser 200, a photodetector 210, a detector circuit 220, a modulation circuit 230, a low-frequency oscillator 240, a detector circuit 250, a voltage controlled crystal oscillator (VCXO) 260, a modulation circuit 270, a low-frequency oscillator 280, a frequency conversion circuit 290, a driving circuit 300, and a heater current control circuit 310. In addition, the atom oscillator of the present embodiment may be formed by appropriately omitting or changing some constituent components (units) shown in FIG. 2 or by appropriately adding other constituent components.

Figure 3A:
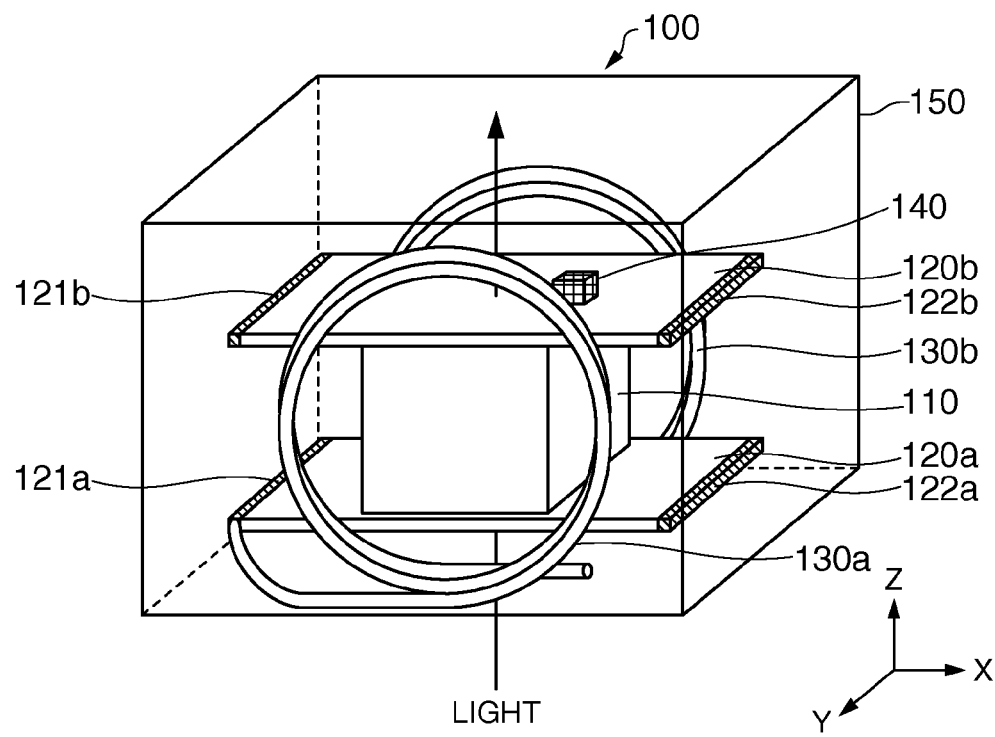
FIGS. 3A and 3B are diagrams showing an example of the structure of a gas cell module in the first embodiment.
Figure 3B:
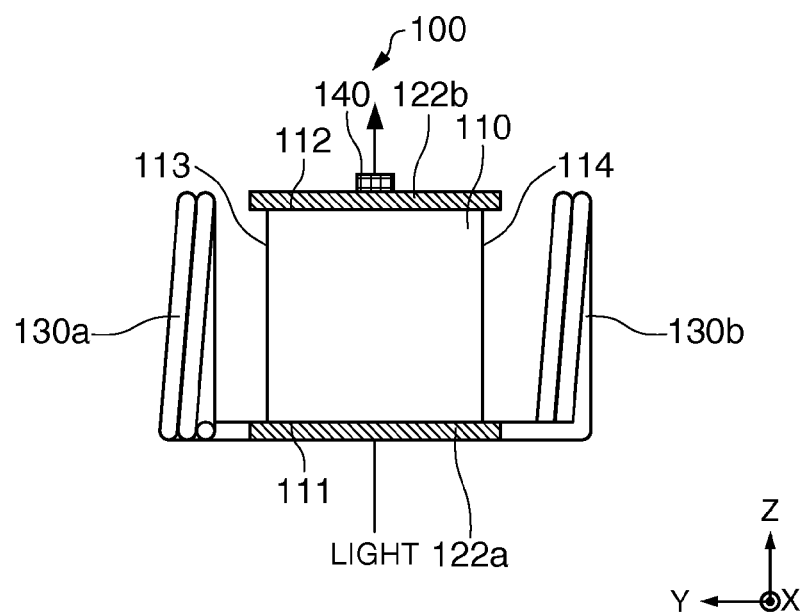

The gas cell module 100 corresponds to the atom cell module 10 shown in FIG. 1, and is configured to include a gas cell 110, heaters 120a and 120b, coils 130a and 130b, a temperature sensor 140, and a magnetic shield 150. FIGS. 3A and 3B show an example of the structure of the gas cell module 100. FIG. 3A is a perspective view of the gas cell module 100, and FIG. 3B is a side view of the gas cell module 100. In FIGS. 3A and 3B, for convenience of explanation, three axes (X, Y, and Z axes) perpendicular to each other are shown. FIG. 3B is a side view of the gas cell module 100 when viewed from the positive direction of the X axis.

The gas cell 110 corresponds to the atom cell 11 shown in FIG. 1, and is formed by filling a container formed of a transparent material, such as glass, with gaseous alkali metal atoms. In the present embodiment, the gas cell 110 has a rectangular parallelepiped shape, and light is incident on a predetermined position (for example, a central point) of one surface (incidence surface) 111 perpendicular to the Z axis, and light transmitted through the gas cell 110 is emitted from a predetermined position (for example, a central point) of the other surface (emission surface) 112. In addition, the gas cell 110 may have a cylindrical shape or may have other shapes.

Both the two heaters 120a and 120b have flat plate shapes, and are provided so as to overlap the incidence surface 111 and the emission surface 112 of the gas cell 110, respectively. Electrodes 121a and 122a are provided at both ends of the heater 120a. In the present embodiment, therefore, the heater 120a generates heat due to a current flowing in a direction from the electrode 121a to the electrode 122a, and the gas cell 110 is heated. Electrodes 121b and 122b are provided at both ends of the heater 120b. In the present embodiment, therefore, the heater 120b generates heat due to a current flowing in a direction from the electrode 122b to the electrode 121b, and the gas cell 110 is heated. In the present embodiment, the heaters 120a and 120b are formed using a transparent conductive film, and light transmitted through the heater 120a is incident on the gas cell 110, and the light transmitted through the gas cell 110 is transmitted through the heater 120b to be emitted. These two heaters 120a and 120b correspond to the heating unit 12 shown in FIG. 1, and a magnetic field corresponding to the current flowing through the heaters 120a and 120b is generated inside the gas cell 110.

The temperature sensor 140 corresponds to the temperature detector 14 shown in FIG. 1, and is disposed on the surface of the heater 120b in the present embodiment. However, the temperature sensor 140 may also be disposed on the surface of the heater 120a or the gas cell 110.

The two coils 130a and 130b are disposed so as to face two surfaces 113 and 114 perpendicular to both the incidence surface 111 and the emission surface 112 of the gas cell 110 (perpendicular to the Y axis), respectively. One end of the coil 130a is connected to the electrode 121a of the heater 120a. In addition, one end of the coil 130b is connected to the electrode 122a of the heater 120a. In addition, under the control of the heater current control circuit 310 shown in FIG. 2, a current having a magnitude corresponding to the output signal of the temperature sensor 140 flows through the coil 130a and then flows from the electrode 121a to the electrode 122a of the heater 120a and further flows through the coil 130b. Alternatively, a current having a magnitude corresponding to the output signal of the temperature sensor 140 flows through the coil 130b and then flows from the electrode 122a to the electrode 121a of the heater 120a and further flows through the coil 130a. These two coils 130a and 130b correspond to the magnetic field generator 13 shown in FIG. 1. The positions or shapes (the number of turns or the diameter) of the two coils 130a and 130b are adjusted such that a magnetic field in an opposite direction to the magnetic field generated by the current flowing through the two heaters 120a and 120b is generated at a predetermined position inside the gas cell 110 by the current flowing through the two coils 130a and 130b.

In addition, although the entire current flowing through the heater 120a flows through the coils 130a and 130b in the present embodiment, it is also possible to adopt a structure where only a part of the current flowing through the heater 120a flows through the coils 130a and 130b.

In addition, in the present embodiment, the coils 130a and 130b are not electrically connected to the heater 120b, and a current having a magnitude corresponding to the output signal of the temperature sensor 140 is directly supplied from the heater current control circuit 310 to the heater 120b in a direction from the electrode 122b to the electrode 121b or in the opposite direction. However, the heater 120b may be electrically connected to at least one of the coils 130a and 130b.

The gas cell 110, the heaters 120a and 120b, the coils 130a and 130b, and the temperature sensor 140 are covered with the magnetic shield 150. The magnetic shield 150 corresponds to the magnetic shielding unit 15 shown in FIG. 1. In addition, although the color of the magnetic shield 150 is not usually a transparent color, the magnetic shield 150 is shown in a transparent color in FIG. 3A in order to show the structure of the gas cell module 100. In addition, the magnetic shield 150 is not shown in FIG. 3B.

Referring to FIG. 2, the semiconductor laser 200 corresponds to the light generator 20 shown in FIG. 1, and generates beams including two light waves as a resonance light pair that causes the EIT phenomenon in alkali metal atoms included in the gas cell 110. Light generated by the semiconductor laser 200 is incident on the gas cell 110.

The photodetector 210 corresponds to the light detector 30 shown in FIG. 1. Light transmitted through the gas cell 110 is incident on the photodetector 210, and the photodetector 210 outputs a detection signal corresponding to the intensity of the incident light. The output signal of the photodetector 210 is input to the detector circuit 220 and the detector circuit 250.

The detector circuit 220 performs synchronous detection of the output signal of the photodetector 210 using an oscillation signal of the low-frequency oscillator 240 that oscillates at a low frequency of about several hertz to hundreds of hertz. In order to enable synchronous detection of the detector circuit 220, the modulation circuit 230 modulates the output signal of the detector circuit 220 with the oscillation signal (the same signal as the oscillation signal supplied to the detector circuit 220) of the low-frequency oscillator 240 as a modulation signal, and outputs it to the driving circuit 300. The modulation circuit 230 can be realized by a frequency mixer, a frequency modulation (FM) circuit, an amplitude modulation (AM) circuit, and the like.

The detector circuit 250 performs synchronous detection of the output signal of the photodetector 210 using an oscillation signal of the low-frequency oscillator 280 that oscillates at a low frequency of about several hertz to hundreds of hertz. In addition, according to the magnitude of the output signal of the detector circuit 250, the oscillation frequency of the voltage controlled crystal oscillator (VCXO) 260 is finely adjusted. For example, the voltage controlled crystal oscillator (VCXO) 260 oscillates at a frequency of about several megahertz to tens of megahertz.

In order to enable synchronous detection of the detector circuit 250, the modulation circuit 270 modulates the output signal of the voltage controlled crystal oscillator (VCXO) 260 with the oscillation signal (the same signal as the oscillation signal supplied to the detector circuit 250) of the low-frequency oscillator 280 as a modulation signal. The modulation circuit 270 can be realized by a frequency mixer, a frequency modulation (FM) circuit, an amplitude modulation (AM) circuit, and the like.

The frequency conversion circuit 290 performs frequency conversion of the output signal of the modulation circuit 270 at a certain frequency conversion rate and outputs the result to the driving circuit 300. For example, the frequency conversion circuit 290 can be realized by a phase locked loop (PLL) circuit.

The driving circuit 300 sets the bias current of the semiconductor laser 200, and also performs fine adjustment of the bias current according to the output signal of the modulation circuit 230 and supplies the adjusted bias current to the semiconductor laser 200. The center wavelength $\lambda_0$ (center frequency $f_0$) of the light generated by the semiconductor laser 200 is finely adjusted by the feedback loop (first feedback loop) passing through the semiconductor laser 200, the gas cell 110, the photodetector 210, the detector circuit 220, the modulation circuit 230, and the driving circuit 300. Specifically, feedback control is performed by the first feedback loop such that the center wavelength $\lambda_0$ (=v/$f_0$) of emitted light of the semiconductor laser 200 almost matches ($\lambda_1+\lambda_2$)/2 (center frequency $f_0$ almost matches ($f_1+f_2$)/2), where the wavelength $\lambda_1$ (=v/$f_1$: v is the speed of light) is equivalent to the energy difference between the excitation level and one ground level of the alkali metal atom and the wavelength $\lambda_2$ (=v/$f_2$) is equivalent to the energy difference between the excitation level and the other ground level.

Figure 4:
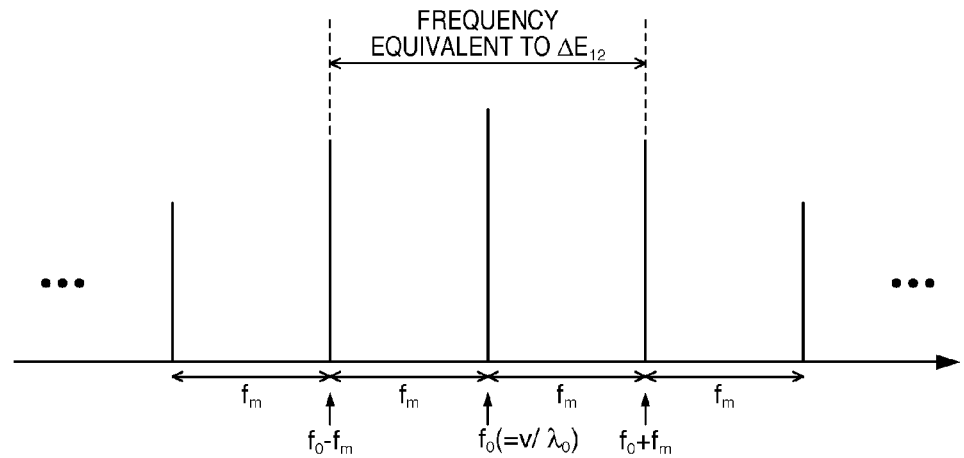
FIG. 4 is a schematic diagram showing an example of the frequency spectrum of emitted light of a semiconductor laser.

In addition, the driving circuit 300 superimposes a current (modulation current) of the output frequency component (modulation frequency $f_m$) of the frequency conversion circuit 290 on the bias current, and supplies it to the semiconductor laser 200. By this modulation current, frequency modulation is applied to the semiconductor laser 200. As a result, a light beam having a center frequency of $f_0$ and light beams having frequencies of $f_0 \pm f_m$, $f_0 \pm 2f_m$, . . . (which are frequencies shifted by $f_m$) on both sides of a light beam having a center frequency of $f_0$ are generated. In addition, by the feedback loop (second feedback loop) passing through the semiconductor laser 200, the gas cell 110, the photodetector 210, the detector circuit 250, the voltage controlled crystal oscillator (VCXO) 260, the modulation circuit 270, the frequency conversion circuit 290, and the driving circuit 300, fine adjustment is performed such that the light having a frequency $f_0+f_m$ and the light having a frequency $f_0-f_m$ become a resonance light pair that causes the EIT phenomenon in the alkali metal atoms enclosed in the gas cell 110. For example, if the alkali metal atom is a cesium atom, the frequency equivalent to $\Delta E_{12}$ is 9.192631770 GHz. Accordingly, the frequency of the output signal of the frequency conversion circuit 290 is stabilized when it matches 4.596315885 GHz. FIG. 4 shows an example of the frequency spectrum of emitted light of the semiconductor laser 200. In FIG. 4, the horizontal axis indicates a frequency of light, and the vertical axis indicates the intensity of light.

In addition, a circuit formed by the detector circuit 220, the modulation circuit 230, the low-frequency oscillator 240, the detector circuit 250, the voltage controlled crystal oscillator (VCXO) 260, the modulation circuit 270, the low-frequency oscillator 280, the frequency conversion circuit 290, and the driving circuit 300 corresponds to the oscillation control section 42 shown in FIG. 1.

The heater current control circuit 310 corresponds to the heating control section 41 shown in FIG. 1, and controls a current flowing through the heaters 120a and 120b according to the temperature detected by the temperature sensor 140 in order to keep the temperature of the gas cell 110 constant. Specifically, when the temperature detected by the temperature sensor 140 rises slightly due to an increase in the outside air temperature, the heater current control circuit 310 reduces the current flowing through heaters 120a and 120b. On the contrary, when the temperature detected by the temperature sensor 140 drops slightly due to a reduction in the outside air temperature, the heater current control circuit 310 increases the current flowing through heaters 120a and 120b.

Figure 5:
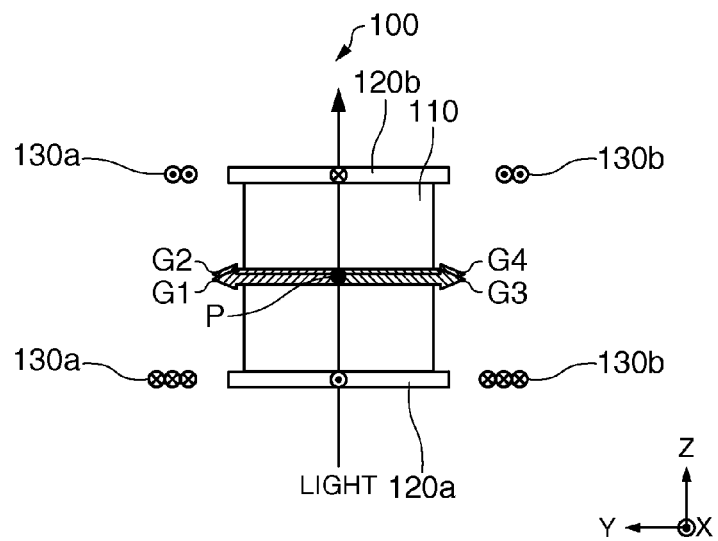
FIG. 5 is a diagram showing an example of the relationship between the direction of the current flowing through a heater and a coil and the direction of the magnetic field generated inside a gas cell.

Since the current flowing through the heaters 120a and 120b also flows through the coils 130a and 130b, a magnetic field due to the current (heater current) flowing through the heaters 120a and 120b and a magnetic field due to the current (coil current) flowing through the coils 130a and 130b are generated inside the gas cell 110. FIG. 5 is a diagram showing an example of the relationship between the direction of the current flowing through the heaters 120a and 120b and the coils 130a and 130b and the direction of the magnetic field generated inside the gas cell 110. FIG. 5 is a cross-sectional view when the gas cell module 100 shown in FIGS. 3A and 3B is cut along the plane, which is parallel to the YZ plane and includes an optical path, and is viewed from the positive direction of the X axis. In addition, the magnetic shield 150 is not shown in FIG. 5.

As shown in FIG. 5, a current flows through the heater 120a, for example, in the +X direction (from the electrode 121a to the electrode 122a). As a result, a +Y-direction magnetic field G1 is generated at a point P on the optical path inside the gas cell 110 (for example, a center position inside the gas cell 110). On the other hand, a current flows through the heater 120b in the −X direction (from the electrode 122b to the electrode 121b). As a result, a +Y-direction magnetic field G2 is generated at the point P.

For example, a current flows through the coil 130a clockwise when viewed from the +Y direction. As a result, a −Y-direction magnetic field G3 is generated at the point P. Similarly, a current also flows through the coil 130b clockwise when viewed from the +Y direction. As a result, a −Y-direction magnetic field G4 is generated at the point P.

Thus, at the point P, directions of the magnetic fields G3 and G4 generated by the current (coil current) flowing through the coils 130a and 130b are opposite to directions of the magnetic fields G1 and G2 generated by the current (heater current) flowing through the heaters 120a and 120b.

Figure 6:
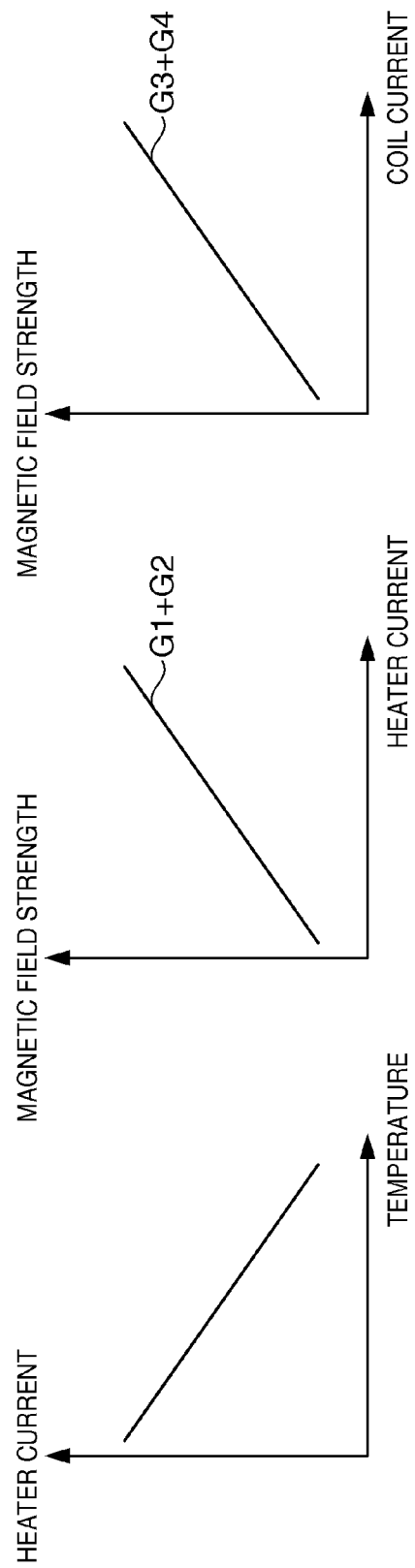
FIG. 6A is a diagram showing the relationship between the outside air temperature and the heater current.
FIG. 6B is a diagram showing the relationship between the heater current and the magnetic field strength.
FIG. 6C is a diagram showing the relationship between the coil current and the magnetic field strength.

Here, in order to keep the temperature of the gas cell 110 almost constant, the heater current decreases almost linearly as the temperature rises (refer to FIG. 6A). The magnetic field G1+G2 increases almost linearly as the heater current increases (refer to FIG. 6B), and the magnetic field G3+G4 increases almost linearly as the coil current increases (refer to FIG. 6C). In the present embodiment, the gas cell module 100 (in particular, the positions or shapes of the coils 130a and 130b) is adjusted such that the directions of the magnetic fields G3 and G4 are opposite to the directions of the magnetic fields G1 and G2 and the magnetic field G3+G4 almost matches the magnetic field G1+G2.

Method of Adjusting the Gas Cell Module

Figure 7:
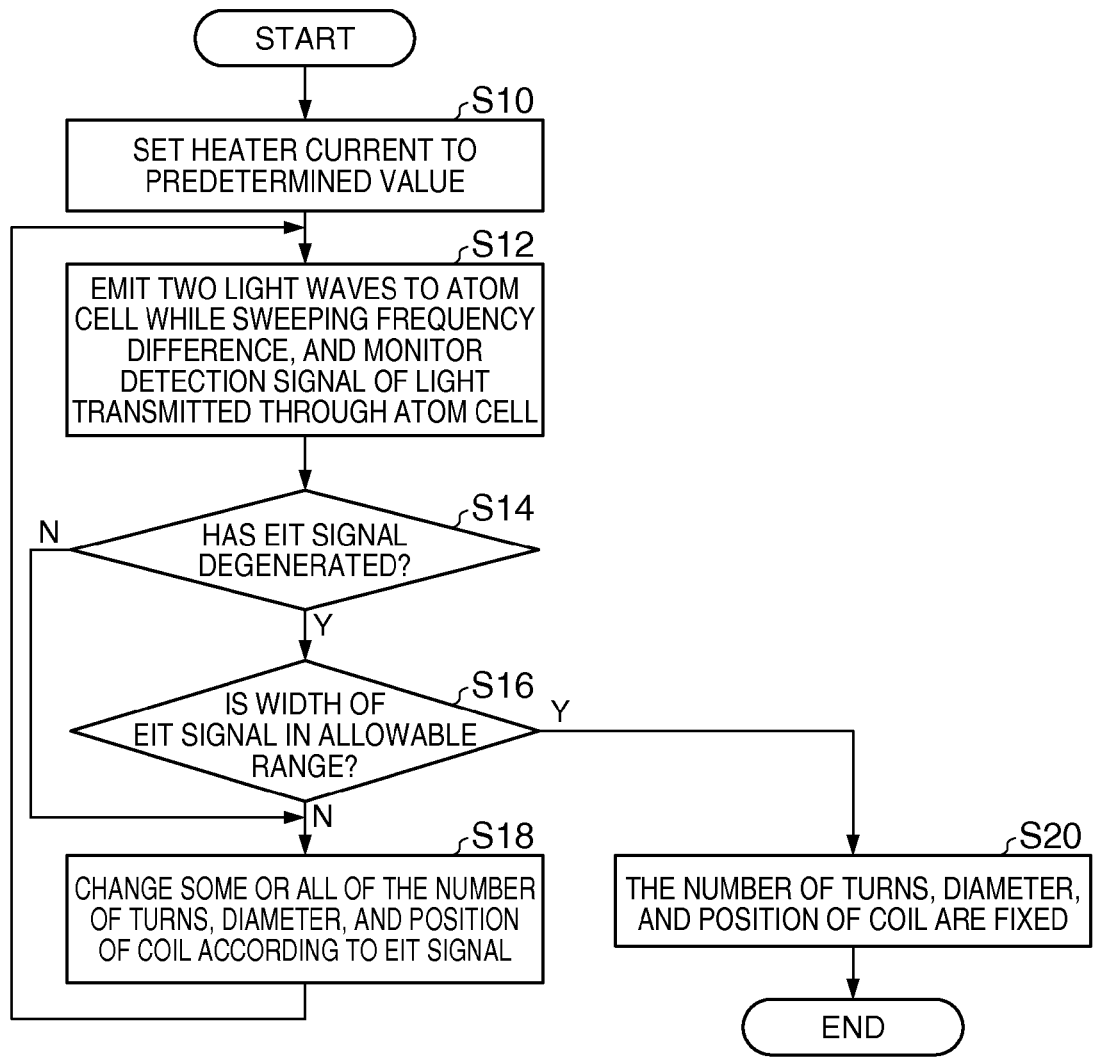
FIG. 7 is a flow chart showing an example of a method of adjusting a gas cell module.

FIG. 7 is a flow chart showing an example of a method of adjusting the gas cell module 100.

First, a heater current flowing through the heaters 120a and 120b is set to a predetermined value (S10).

Figure 8A:
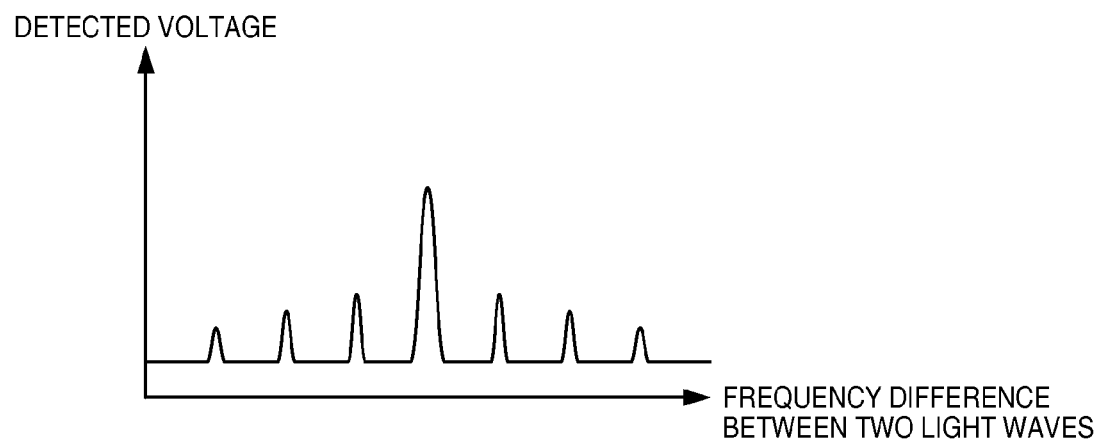
FIG. 8A is a diagram showing an example of the split EIT signal.
Figure 8B:
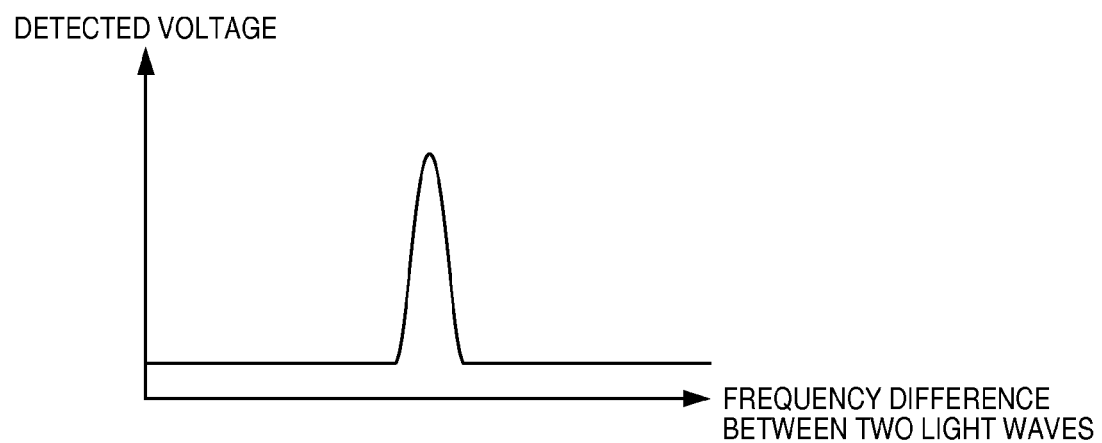
FIG. 8B is a diagram showing an example of the degenerate EIT signal.

Then, two light waves are emitted to the atom cell while sweeping the frequency difference, and a detection signal of the light transmitted through the atom cell is monitored (S12). For example, if the strength of the magnetic field G1+G2 generated by the heater current and the strength of the magnetic field G3+G4 generated by the coil current are different at the point P shown in FIG. 5, the EIT signal is split at intervals of the frequency corresponding to the strength difference (refer to FIG. 8A). On the other hand, if the strength of the magnetic field G1+G2 almost matches the strength of the magnetic field G3+G4, the EIT signal degenerates into one (refer to FIG. 8B).

When a result of monitoring in step S12 is that the EIT signal does not degenerate (N of S14), some or all of the number of turns, diameters, and positions of the coils 130a and 130b are changed according to the split EIT signal (S18), and the monitoring in step S12 is performed again.

When a result of monitoring in step S12 is that the EIT signal degenerates (Y of S14), if the width of the EIT signal is not in the allowable range (N of S16), some or all of the number of turns, diameters, and positions of the coils 130a and 130b are changed (S18), and the monitoring in step S12 is performed again. On the other hand, if the width of the EIT signal is in the allowable range (Y of S16), the number of turns, diameters, and positions of the coils 130a and 130b are fixed (S20), and the adjustment of the gas cell module 100 is ended.

As described above, according to the atom oscillator of the first embodiment, the gas cell module 100 is adjusted, for example, according to the flow chart shown in FIG. 7. Therefore, when the heater current is a predetermined value, at a predetermined position on the optical path inside the gas cell 110 (for example, a center position inside the gas cell 110), a magnetic field generated by the coil current flowing through the coils 130a and 130b and a magnetic field generated by the current flowing through the heaters 120a and 120b cancel each other out since these magnetic fields have almost the same strength in opposite directions. As a result, a degenerate EIT signal with high signal strength is obtained. In the present embodiment, even if the strength of the magnetic field generated by the heater current is changed due to changes in the outside air temperature, the strength of the magnetic field generated by the coil current is similarly changed. Accordingly, since the magnetic fields cancel each other out, a degenerate EIT signal with high signal strength can be obtained regardless of the outside air temperature. Therefore, an atom oscillator with high frequency stability can be realized by performing feedback control so as to be locked to the degenerate EIT signal.

1-2. Second Embodiment

Functional Configuration of an Atom Oscillator

Figure 9:
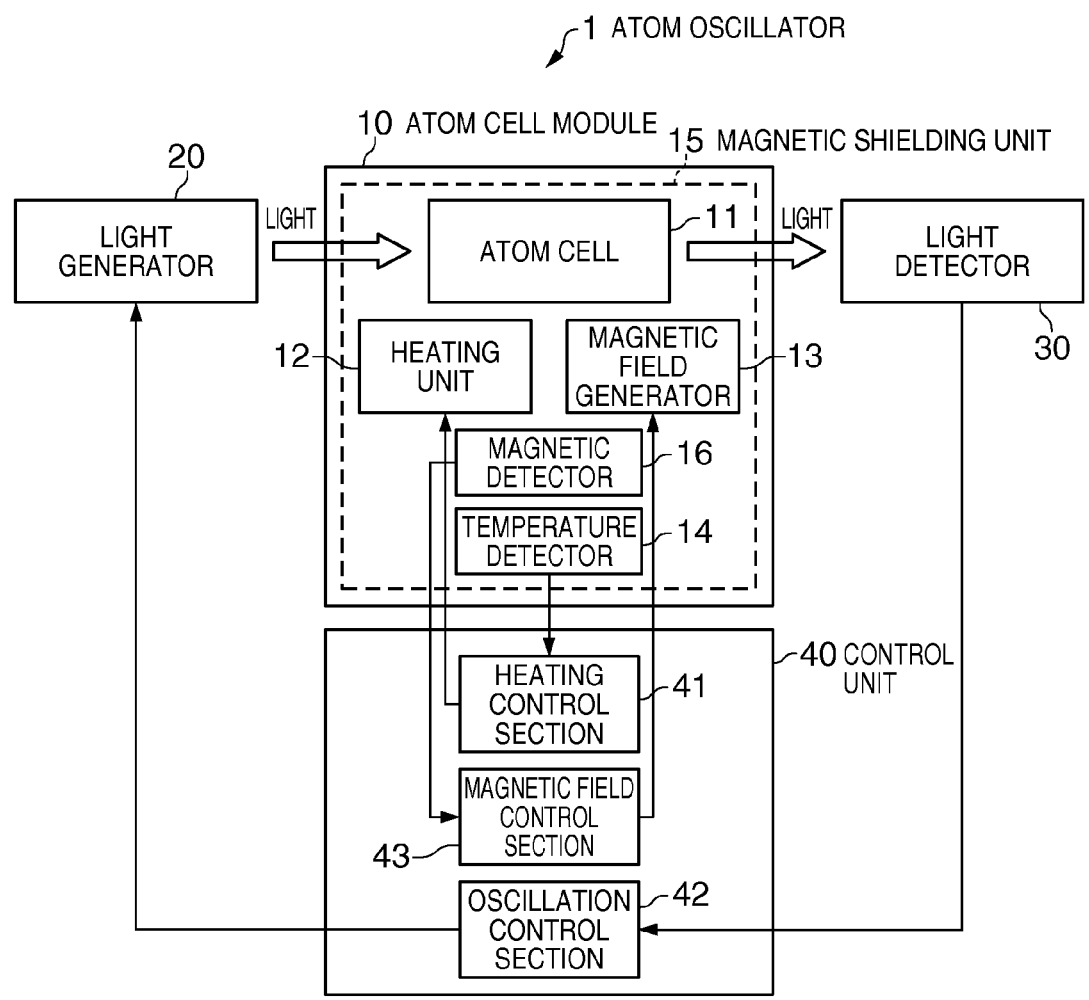
FIG. 9 is a functional block diagram of an atom oscillator of a second embodiment.

FIG. 9 is a functional block diagram of an atom oscillator of a second embodiment. In FIG. 9, the same constituent components as in FIG. 1 are denoted by the same reference numerals. In addition, the atom oscillator of the present embodiment may be formed by appropriately omitting or changing some constituent components (units) shown in FIG. 9 or by appropriately adding other constituent components.

As shown in FIG. 9, an atom oscillator 1 of the second embodiment is different from the atom oscillator 1 of the first embodiment in that a magnetic detector 16 is added to the atom cell module 10 and a magnetic field control section 43 is added to the control unit 40. In addition, the function of the magnetic field generator 13 is different from that in the first embodiment.

The magnetic field generator 13 generates a magnetic field inside the atom cell 11. The shape or the arrangement of the magnetic field generator 13 is determined such that a magnetic field at a predetermined position inside the atom cell 11 generated by the magnetic field generator 13 (for example, a position on the optical path inside the atom cell 11) includes a magnetic field component in an opposite direction to a magnetic field at the predetermined position generated on the basis of a current flowing through the heating unit 12. For example, such a magnetic field generator 13 can be realized by a coil. The direction or the magnitude of the magnetic field at a predetermined position inside the atom cell 11 can be adjusted by changing the position or the shape of the coil (for example, the number of turns or the diameter of the coil), the direction of current flowing through the coil (or the direction of winding of the coil), or the magnitude of current. For example, it is possible to perform adjustment such that the magnetic field generated by the heating unit 12 and the magnetic field generated by the magnetic field generator 13 cancel each other out (such that the magnetic field strength becomes close to 0) at a predetermined position on the optical path inside the atom cell 11.

The magnetic detector 16 is provided at a position where changes in the strength of the magnetic field generated on the basis of the current flowing through the heating unit 12 can be detected. For example, the magnetic detector 16 may be disposed adjacent to the heating unit 12 or the atom cell 11. For example, the magnetic detector 16 can be realized by a magnetic sensor, such as a coil or a hall element.

The magnetic field control section 43 controls a magnetic field generated by the magnetic field generator 13 so that the variation of the magnetic field at a predetermined position inside the atom cell 11 caused by the changes in the current flowing through the heating unit 12 is reduced. In particular, in the present embodiment, the magnetic field control section 43 controls the magnetic field generated by the magnetic field generator 13 according to a detection signal of the magnetic detector 16. For example, the magnetic field control section 43 may perform control to strengthen the magnetic field generated by the magnetic field generator 13 in proportion to the strength of the magnetic field detected by the magnetic detector 16.

Since the other functional configuration of the atom oscillator 1 of the second embodiment is the same as that in the first embodiment, explanation thereof will be omitted.

Specific Configuration of the Atom Oscillator

Figure 10:
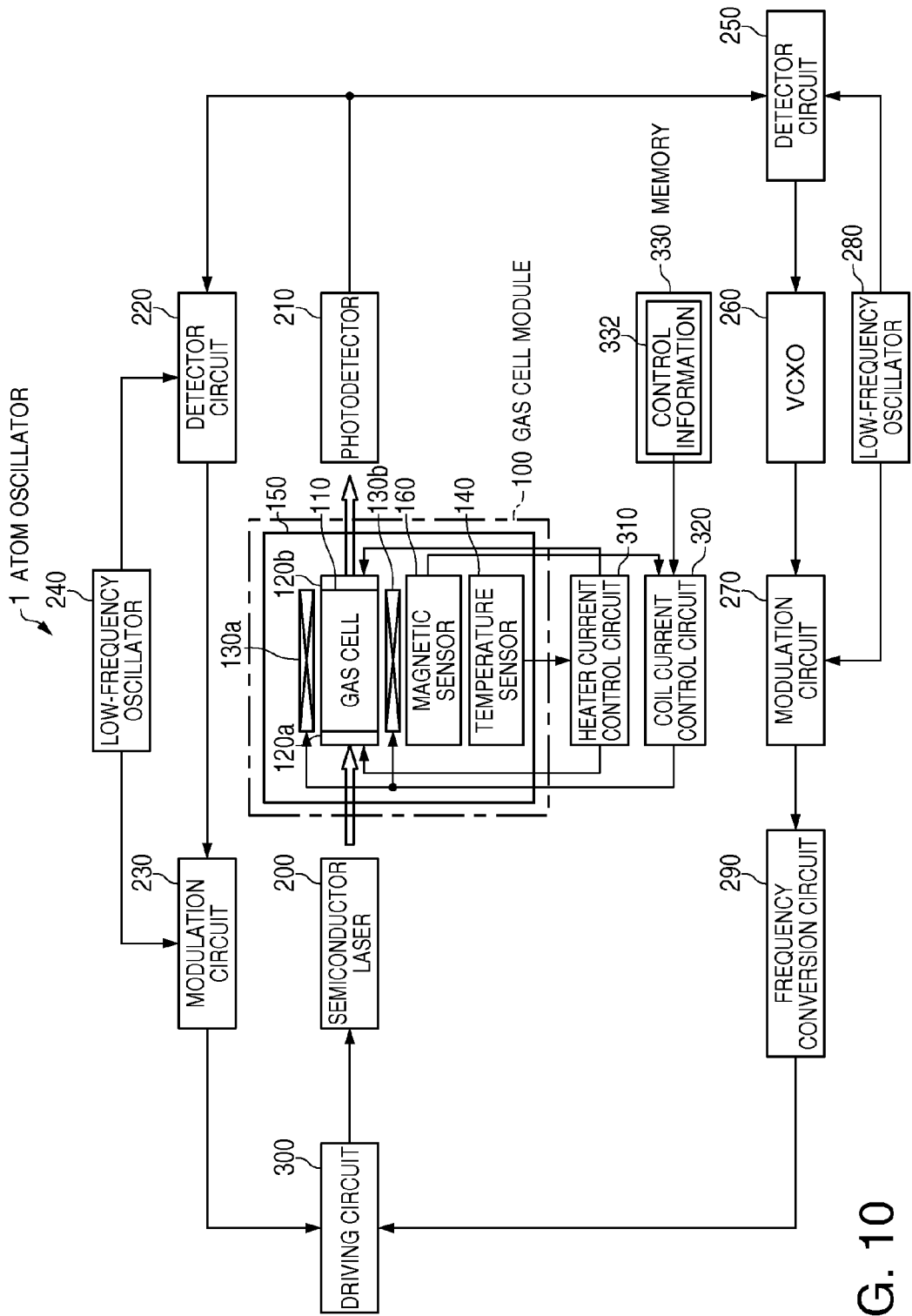
FIG. 10 is a diagram showing an example of the specific configuration of the atom oscillator of the second embodiment.

FIG. 10 is a diagram showing an example of the specific configuration of the atom oscillator 1 of the second embodiment. In FIG. 10, the same constituent components as in FIG. 2 are denoted by the same reference numerals. In addition, the atom oscillator of the present embodiment may be formed by appropriately omitting or changing some constituent components (units) shown in FIG. 10 or by appropriately adding other constituent components.

Figure 11A:
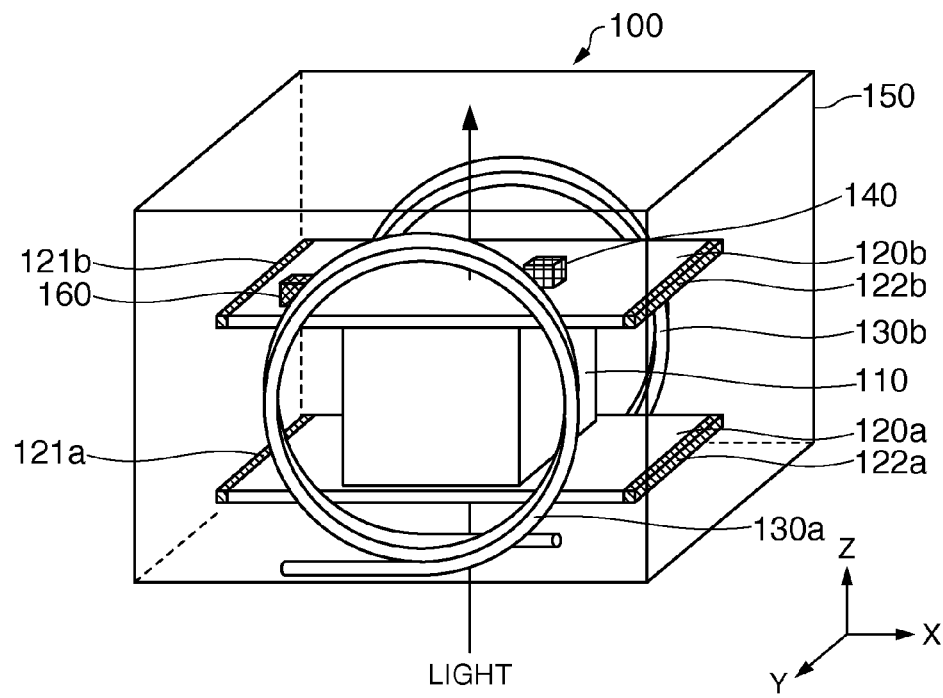
FIGS. 11A and 11B are diagrams showing an example of the structure of a gas cell module in the second embodiment.
Figure 11B:
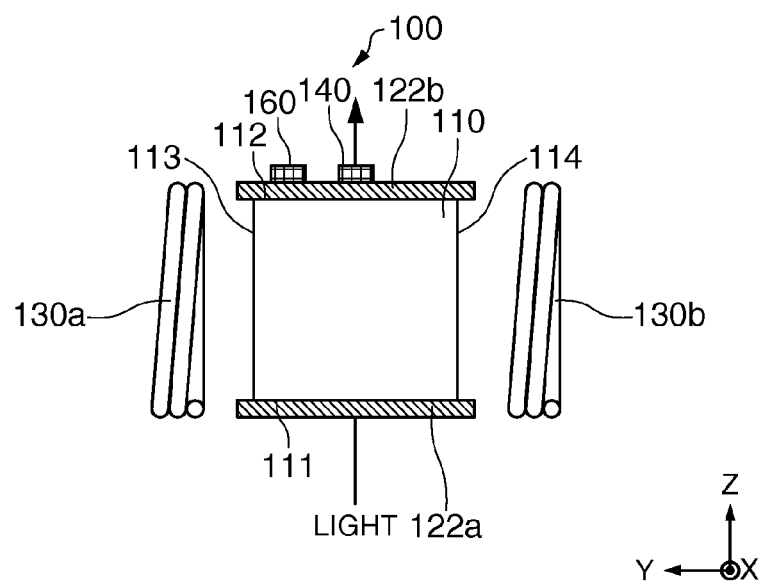

As shown in FIG. 10, the atom oscillator 1 of the second embodiment is different from the atom oscillator 1 of the first embodiment in that a coil current control circuit 320 is added and a magnetic sensor 160 is added to the gas cell module 100. FIGS. 11A and 11B show an example of the structure of the gas cell module 100 in the present embodiment. FIG. 11A is a perspective view of the gas cell module 100, and FIG. 11B is a side view of the gas cell module 100. In FIGS. 11A and 11B, for convenience of explanation, three axes (X, Y, and Z axes) perpendicular to each other are shown. FIG. 11B is a side view of the gas cell module 100 when viewed from the positive direction of the X axis.

The structure and the arrangement of the gas cell 110, the heaters 120a and 120b, and the temperature sensor 140 are the same as those in the first embodiment, and explanation thereof will be omitted.

The magnetic sensor 160 corresponds to the magnetic detector 16 shown in FIG. 9, and is provided at a predetermined position inside the magnetic shield 150. Although the magnetic sensor 160 is disposed on the surface of the heater 120b in the present embodiment, the magnetic sensor 160 may be disposed on the surface of the heater 120a or the gas cell 110, or may be disposed inside the gas cell 110. Since the temperature of the surface of the heaters 120a and 120b or the temperature of the surface and inside of the gas cell 110 are kept almost constant, it is not necessary to correct the temperature characteristic of the magnetic sensor 160 by placing the magnetic sensor in one of these locations.

Two coils 130a and 130b are disposed so as to face two surfaces 113 and 114 perpendicular to both the incidence surface 111 and the emission surface 112 of the gas cell 110 (perpendicular to the Y axis), respectively, but the two coils 130a and 130b are not electrically connected to the heaters 120a and 120b unlike the first embodiment. Under the control of the coil current control circuit 320 shown in FIG. 10, a current having a magnitude corresponding to the output signal of the magnetic sensor 160 flows through the coils 130a and 130b. These two coils 130a and 130b correspond to the magnetic field generator 13 shown in FIG. 9. The positions or shapes (the number of turns or the diameter) of the two coils 130a and 130b are adjusted such that a magnetic field in an opposite direction to the magnetic field generated by the current flowing through the two heaters 120a and 120b is generated at a predetermined position inside the gas cell 110 by the current flowing through the two coils 130a and 130b.

Referring back to FIG. 10, a memory 330 is a nonvolatile memory, and control information 332 is stored in the memory 330. The control information 332 is information in which the correspondence relationship between the detected value of the magnetic sensor 160 and the setting value of the coil current is defined.

The coil current control circuit 320 corresponds to the magnetic field control section 43 shown in FIG. 9, and controls a current (coil current) flowing through the coils 130a and 130b on the basis of the detected value of the magnetic sensor 160 and the control information 332. Specifically, when the detected value of the magnetic sensor 160 has changed by a predetermined amount or more, the coil current control circuit 320 changes the coil current to the setting value corresponding to the detected value of the magnetic sensor 160 in the control information 332. When the setting value of the coil current corresponding to the detected value of the magnetic sensor 160 is not defined in the control information 332, it is preferable to calculate the setting value of the coil current using a method, such as linear interpolation.

Since the other specific configurations of the atom oscillator 1 of the second embodiment are the same as that in the first embodiment, explanation thereof will be omitted.

A magnetic field due to the heater current and a magnetic field due to the coil current are generated inside the gas cell 110. In the present embodiment, a current flows through the heater 120a, for example, in the +X direction (from the electrode 121a to the electrode 122a). As a result, a +Y-direction magnetic field G1 is generated at a point P on the optical path inside the gas cell 110 (for example, a center position inside the gas cell 110). On the other hand, a current flows through the heater 120b in the −X direction (from the electrode 122b to the electrode 121b). As a result, a +Y-direction magnetic field G2 is generated at the point P.

For example, a current flows through the coil 130a clockwise when viewed from the +Y direction. As a result, a −Y-direction magnetic field G3 is generated at the point P. Similarly, a current also flows through the coil 130b clockwise when viewed from the +Y direction. As a result, a −Y-direction magnetic field G4 is generated at the point P.

In addition, since the directions of the heater current and the coil current and the directions of the magnetic fields G1, G2, G3, and G4 are the same as those in FIG. 5, a figure thereof will be omitted.

Thus, at the point P, directions of the magnetic fields G3 and G4 generated by the current (coil current) flowing through the coils 130a and 130b are opposite to directions of the magnetic fields G1 and G2 generated by the current (heater current) flowing through the heaters 120a and 120b. In the present embodiment, the coil current is controlled by the coil current control circuit 320 such that the magnetic field G3+G4 almost matches the magnetic field G1+G2 constantly for the variation range of the outside air temperature.

Method of Creating Control Information

Figure 12:
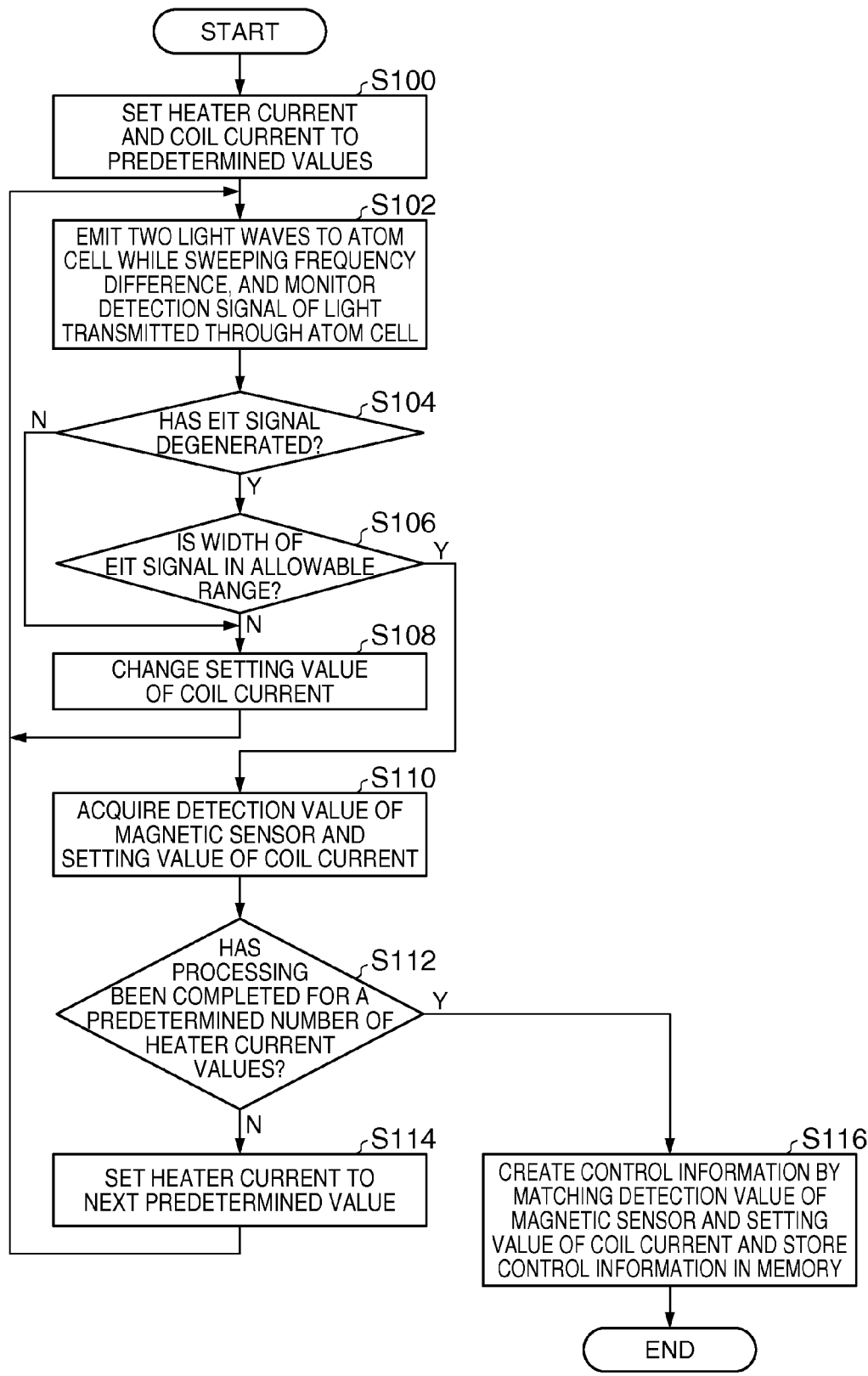
FIG. 12 is a flowchart showing an example of a method of creating the control information.

FIG. 12 is a flow chart showing an example of a method of creating the control information 332.

First, a heater current flowing through the heaters 120a and 120b and a coil current flowing through the coils 130a and 130b are set to predetermined values (S100).

Then, two light waves are emitted to the atom cell while sweeping the frequency difference, and a detection signal of the light transmitted through the atom cell is monitored (S102).

When a result of monitoring in step S102 is that the EIT signal does not degenerate (N of S104), the setting value of the coil current is changed according to the split EIT signal (S108), and the monitoring in step S102 is performed again.

When a result of monitoring in step S102 is that the EIT signal degenerates (Y of S104), if the width of the EIT signal is not in the allowable range (N of S106), the setting value of the coil current is changed (S108), and the monitoring in step S102 is performed again. On the other hand, if the width of the EIT signal is in the allowable range (Y of S106), the detected value of the magnetic sensor 160 and the setting value of the coil current are acquired (S110).

Then, if the processing of steps S102 to S110 has not been completed for a predetermined number of heater current values (N of S112), the heater current is set to the next predetermined value (S114), and the processing of steps S102 to S110 is performed.

On the other hand, if the processing of steps S102 to S110 has been completed for a predetermined number of heater current values (Y of S112), the control information 332 is created by matching the detected values of the magnetic sensor 160 and the setting values of the coil current acquired in step S110 and is stored in the memory 330 (S116), and the process is ended.

As described above, according to the atom oscillator of the second embodiment, since the setting value of the coil current is changed according to the detected value of the magnetic sensor 160 on the basis of the control information 332 created, for example, according to the flow chart shown in FIG. 12, the strength of the magnetic field generated by the coil current is similarly changed even if the strength of the magnetic field generated by the heater current is changed due to changes in the outside air temperature. Therefore, since the magnetic fields cancel each other out, a degenerate EIT signal with high signal strength can be obtained regardless of the outside air temperature.

In addition, if the size of the atom oscillator 1 is reduced, a sufficient magnetic shield 150 may not be provided in the gas cell module 100. However, according to the atom oscillator of the present embodiment, the magnetic sensor 160 detects not only the magnetic field due to the heater current or the coil current but also the magnetic field due to an external magnetic field. Therefore, by controlling the coil current using the control information 332, a degenerate EIT signal with high signal strength can always be obtained even if an external magnetic field is changed.

Therefore, an atom oscillator with high frequency stability can be realized by performing feedback control so as to be locked to the degenerate EIT signal.

1-3. Third Embodiment

Functional Configuration of an Atom Oscillator

Figure 13:
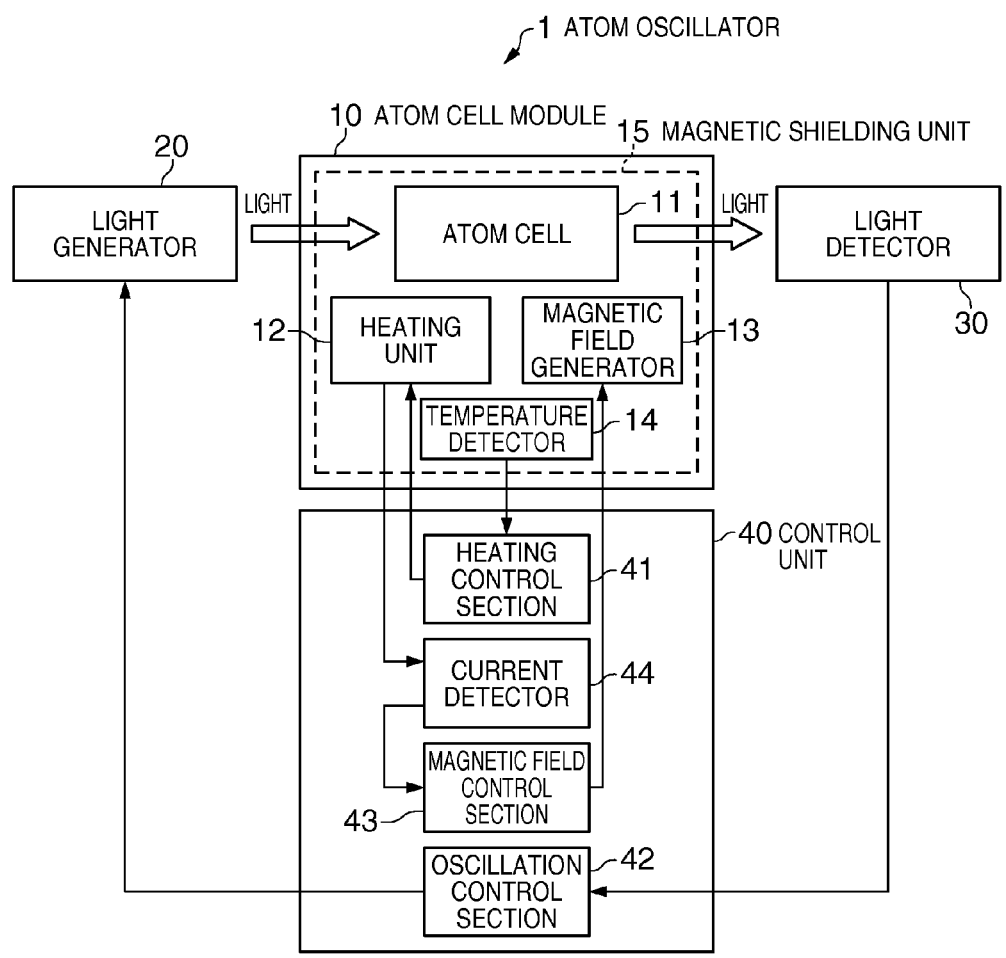
FIG. 13 is a functional block diagram of an atom oscillator of a third embodiment.

FIG. 13 is a functional block diagram of an atom oscillator of a third embodiment. In FIG. 13, the same constituent components as in FIG. 9 are denoted by the same reference numerals. In addition, the atom oscillator of the present embodiment may be formed by appropriately omitting or changing some constituent components (units) shown in FIG. 13 or by appropriately adding other constituent components.

As shown in FIG. 13, an atom oscillator 1 of the third embodiment is different from the atom oscillator 1 of the second embodiment in that a current detector 44 is added to the control unit 40 instead of the magnetic detector 16 of the atom cell module 10. In addition, the function of the magnetic field control section 43 is different from that in the second embodiment.

The current detector 44 detects a current flowing through the heating unit 12.

The magnetic field control section 43 controls a magnetic field generated by the magnetic field generator 13 according to the detection signal of the current detector 44. For example, the magnetic field control section 43 may perform control to strengthen the magnetic field generated by the magnetic field generator 13 in proportion to the magnitude of the current detected by the current detector 44.

Since the other functional configurations of the atom oscillator 1 of the third embodiment are the same as that in the second embodiment, explanation thereof will be omitted.

Specific Configuration of the Atom Oscillator

Figure 14:
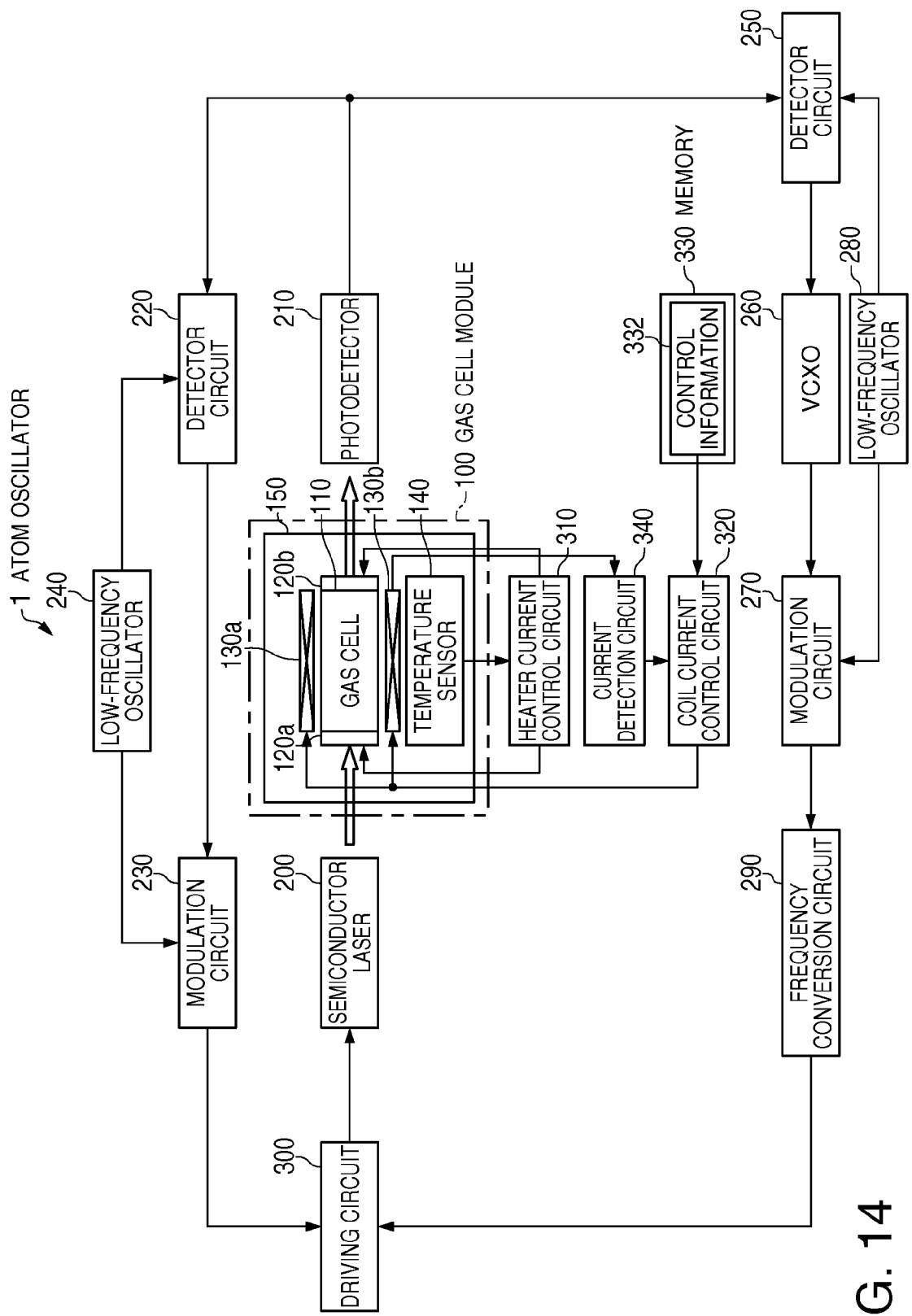
FIG. 14 is a diagram showing an example of the specific configuration of the atom oscillator of the third embodiment.

FIG. 14 is a diagram showing an example of the specific configuration of the atom oscillator 1 of the third embodiment. In FIG. 14, the same constituent components as in FIG. 10 are denoted by the same reference numerals. In addition, the atom oscillator of the present embodiment may be formed by appropriately omitting or changing some constituent components (units) shown in FIG. 14 or by appropriately adding other constituent components.

As shown in FIG. 14, in the atom oscillator 1 of the third embodiment, a current detection circuit 340 is provided instead of the magnetic sensor 160 for the atom oscillator 1 of the second embodiment.

The current detection circuit 340 corresponds to the current detector 44 shown in FIG. 13, and detects a heater current flowing through one or both of the heaters 120a and 120b.

In the present embodiment, unlike in the second embodiment, the control information 332 is information in which the correspondence relationship between the detected value of the current detection circuit 340 and the setting value of the coil current is defined.

The coil current control circuit 320 corresponds to the magnetic field control section 43 shown in FIG. 13, and controls a current (coil current) flowing through the coils 130a and 130b on the basis of the detected value of the current detection circuit 340 and the control information 332. Specifically, when the detected value of the current detection circuit 340 has changed by a predetermined amount or more, the coil current control circuit 320 changes the coil current to the setting value corresponding to the detected value of the current detection circuit 340 in the control information 332. When the setting value of the coil current corresponding to the detected value of the current detection circuit 340 is not defined in the control information 332, it is preferable to calculate the setting value of the coil current using a method, such as linear interpolation.

Figure 15A:
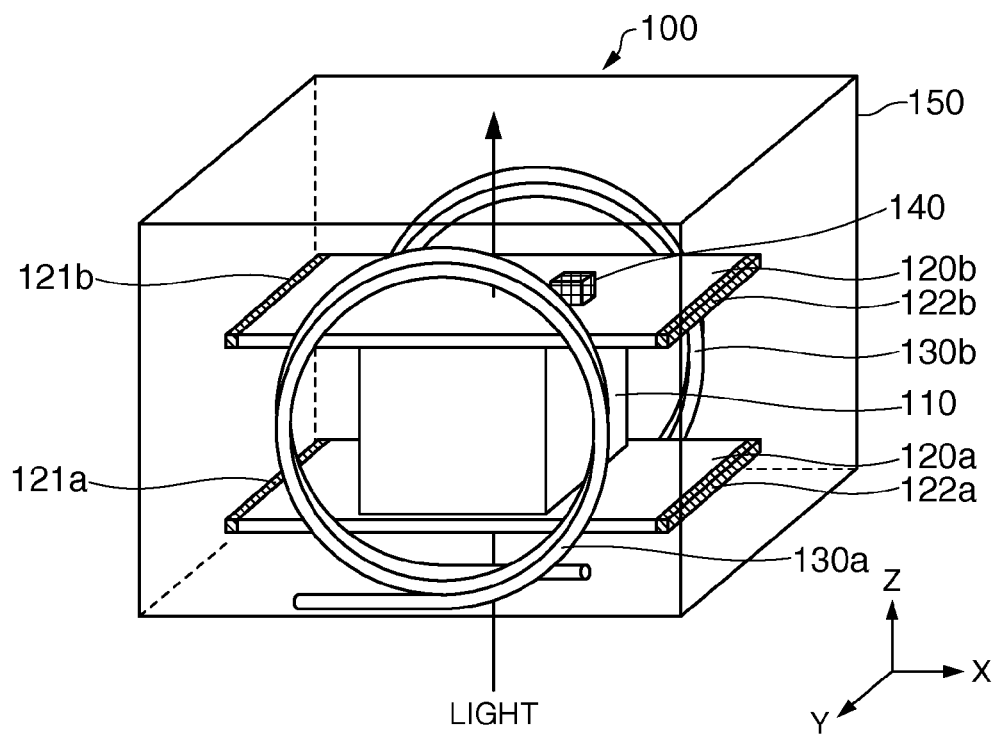
FIGS. 15A and 15B are diagrams showing an example of the structure of a gas cell module in the third embodiment.
Figure 15B:
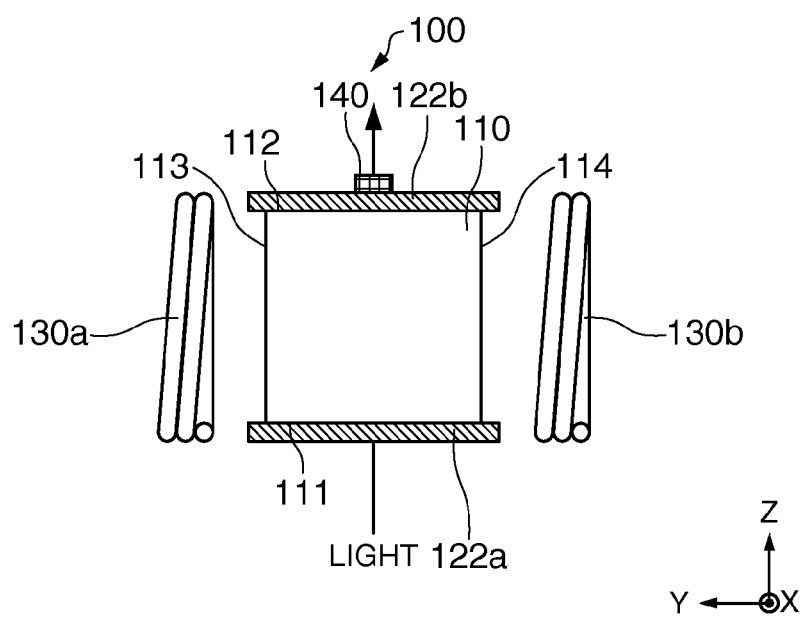

In addition, as shown in FIGS. 15A and 15B, the structure of the gas cell module 100 in the present embodiment is the same as the gas cell module 100 (refer to FIGS. 11A and 11B) of the second embodiment except that the magnetic sensor 160 is removed. Accordingly, explanation thereof will be omitted.

Since the other specific configurations of the atom oscillator 1 of the third embodiment are the same as that in the second embodiment, explanation thereof will be omitted.

A magnetic field due to the heater current and a magnetic field due to the coil current are generated inside the gas cell 110. In the present embodiment, a current flows through the heater 120a, for example, in the +X direction (from the electrode 121a to the electrode 122a). As a result, a +Y-direction magnetic field G1 is generated at a point P on the optical path inside the gas cell 110 (for example, a center position inside the gas cell 110). On the other hand, a current flows through the heater 120b in the −X direction (from the electrode 122b to the electrode 121b). As a result, a +Y-direction magnetic field G2 is generated at the point P.

For example, a current flows through the coil 130a clockwise when viewed from the +Y direction. As a result, a −Y-direction magnetic field G3 is generated at the point P. Similarly, a current also flows through the coil 130b clockwise when viewed from the +Y direction. As a result, a −Y-direction magnetic field G4 is generated at the point P.

In addition, since the directions of the heater current and the coil current and the directions of the magnetic fields G1, G2, G3, and G4 are the same as those in FIG. 5, a figure thereof will be omitted.

Thus, at the point P, directions of the magnetic fields G3 and G4 generated by the current (coil current) flowing through the coils 130a and 130b are opposite to directions of the magnetic fields G1 and G2 generated by the current (heater current) flowing through the heaters 120a and 120b. In the present embodiment, the coil current is controlled by the coil current control circuit 320 such that the magnetic field G3+G4 almost matches the magnetic field G1+G2 constantly for the variation range of the outside air temperature.

Method of Creating Control Information

Figure 16:
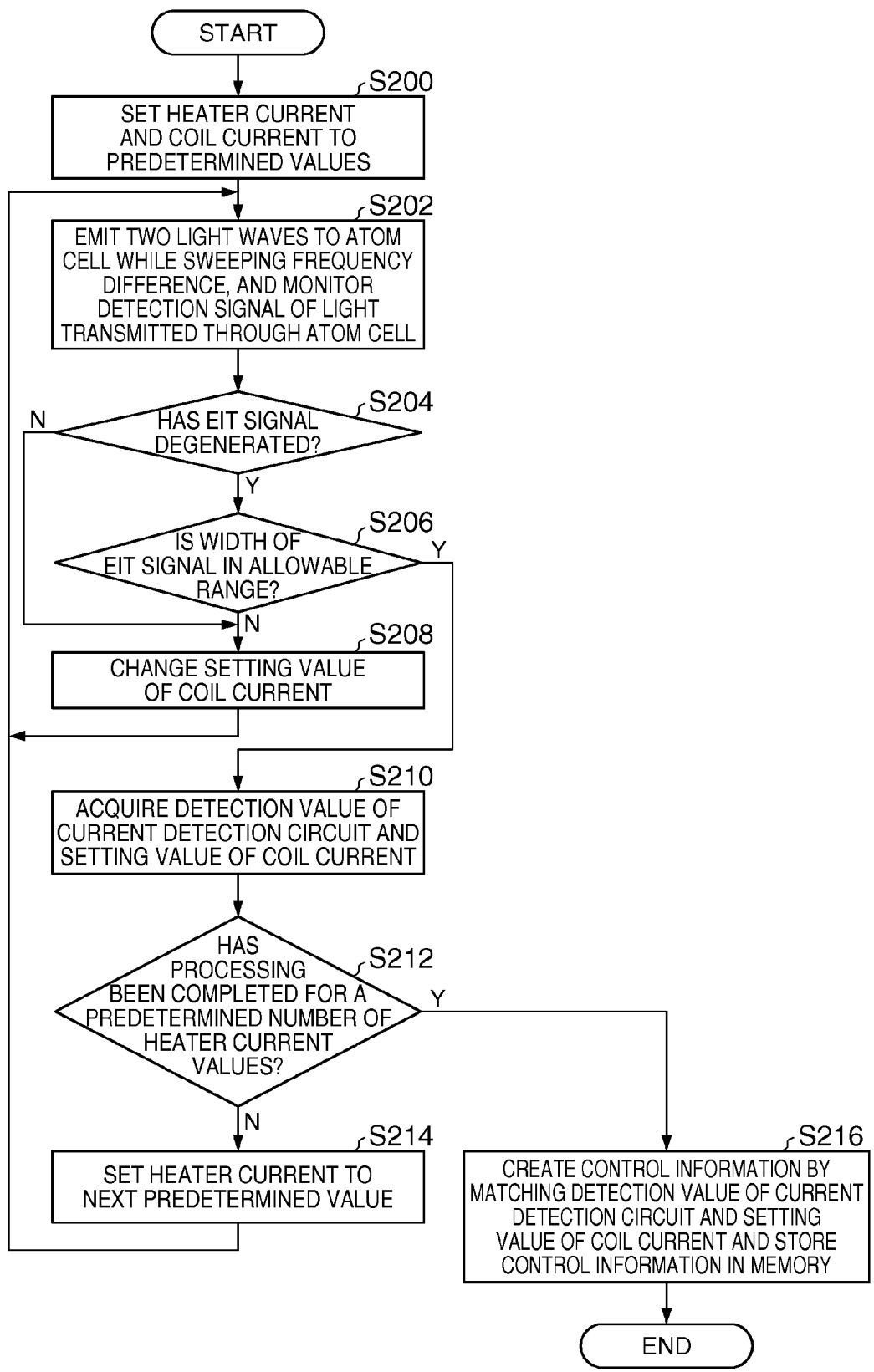
FIG. 16 is a flowchart showing an example of a method of creating the control information.

FIG. 16 is a flowchart showing an example of a method of creating the control information 332.

First, a heater current flowing through the heaters 120a and 120b and a coil current flowing through the coils 130a and 130b are set to predetermined values (S200).

Then, two light waves are emitted to the atom cell while sweeping the frequency difference, and a detection signal of the light transmitted through the atom cell is monitored (S202).

When a result of monitoring in step S202 is that the EIT signal does not degenerate (N of S204), the setting value of the coil current is changed according to the split EIT signal (S208), and the monitoring in step S202 is performed again.

When a result of monitoring in step S202 is that the EIT signal degenerates (Y of S204), if the width of the EIT signal is not in the allowable range (N of S206), the setting value of the coil current is changed (S208), and the monitoring in step S202 is performed again. On the other hand, if the width of the EIT signal is in the allowable range (Y of S206), the detected value of the current detection circuit 340 and the setting value of the coil current are acquired (S210).

Then, if the processing of steps S202 to S210 has not been completed for a predetermined number of heater current values (N of S212), the heater current is set to the next predetermined value (S214), and the processing of steps S202 to S210 is performed.

On the other hand, if the processing of steps S202 to S210 has been completed for a predetermined number of heater current values (Y of S212), the control information 332 is created by matching the detected values of the current detection circuit 340 and the setting values of the coil current acquired in step S210 and is stored in the memory 330 (S216), and the process is ended.

As described above, according to the atom oscillator of the third embodiment, since the setting value of the coil current is changed according to the detected value of the current detection circuit 340 on the basis of the control information 332 created, for example, according to the flow chart shown in FIG. 16, the strength of the magnetic field generated by the coil current is similarly changed even if the strength of the magnetic field generated by the heater current is changed due to changes in the outside air temperature. Therefore, since the magnetic fields cancel each other out, a degenerate EIT signal with high signal strength can be obtained regardless of the outside air temperature. Therefore, an atom oscillator with high frequency stability can be realized by performing feedback control so as to be locked to the degenerate EIT signal.

2. ELECTRONIC APPARATUS

Figure 17:
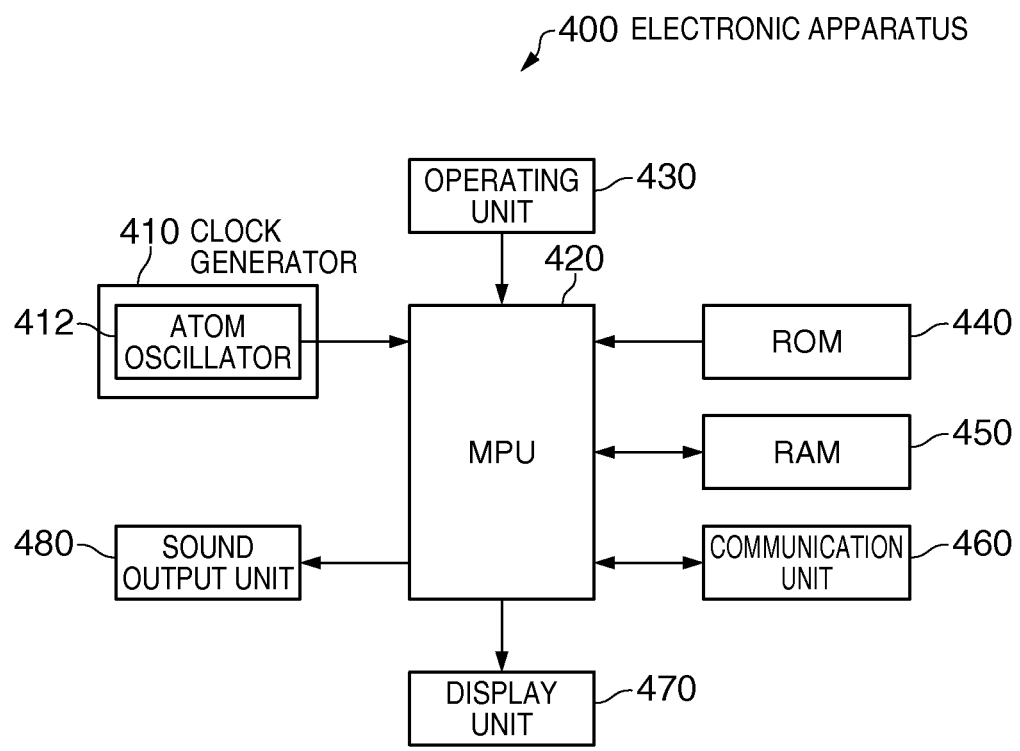
FIG. 17 is functional block diagram of an electronic apparatus of the present embodiment.

FIG. 17 is a functional block diagram of an electronic apparatus of the present embodiment. An electronic apparatus 400 of the present embodiment is configured to include a clock generator 410, a micro processing unit (MPU) 420, an operating unit 430, a read only memory (ROM) 440, a random access memory (RAM) 450, a communication unit 460, a display unit 470, and a sound output unit 480. In addition, the electronic apparatus of the present embodiment may be formed by omitting or changing some constituent components (units) shown in FIG. 17 or by adding other constituent components.

The clock generator 410 generates various kinds of clock signals with the oscillation signal of an atom oscillator 412 as an original oscillation clock. For example, the atom oscillator 412 is the atom oscillator 1 of the embodiment described above.

The MPU 420 performs various kinds of computation processing or control processing according to a program stored in the ROM 440 or the like using various kinds of clock signals generated by the clock generator 410. Specifically, the MPU 420 performs various kinds of processing according to the operation signal from the operating unit 430, processing of controlling the communication unit 460 in order to perform data communication with the outside, processing of transmitting a display signal for displaying various kinds of information on the display unit 470, processing of making the sound output unit 480 output various kinds of sound, and the like.

The operating unit 430 is an input device configured to include operation keys, button switches, and the like, and outputs an operation signal according to the operation of the user to the MPU 420.

The ROM 440 stores a program, data, and the like used when the MPU 420 performs various kinds of computation processing or control processing.

The RAM 450 is used as a work area of the MPU 420, and temporarily stores a program or data read from the ROM 440, data input through the operating unit 430, results of operations executed by the MPU 420 according to various programs, and the like.

The communication unit 460 performs various kinds of control for establishing data communication between the MPU 420 and an external device.

The display unit 470 is a display device formed by a liquid crystal display (LCD) or the like, and displays various kinds of information on the basis of a display signal input from the MPU 420.

The sound output unit 480 is a device that outputs a sound, such as a speaker.

A more reliable electronic apparatus can be realized by adding the atom oscillator 1 of the present embodiment as the atom oscillator 412.

Figure 18:
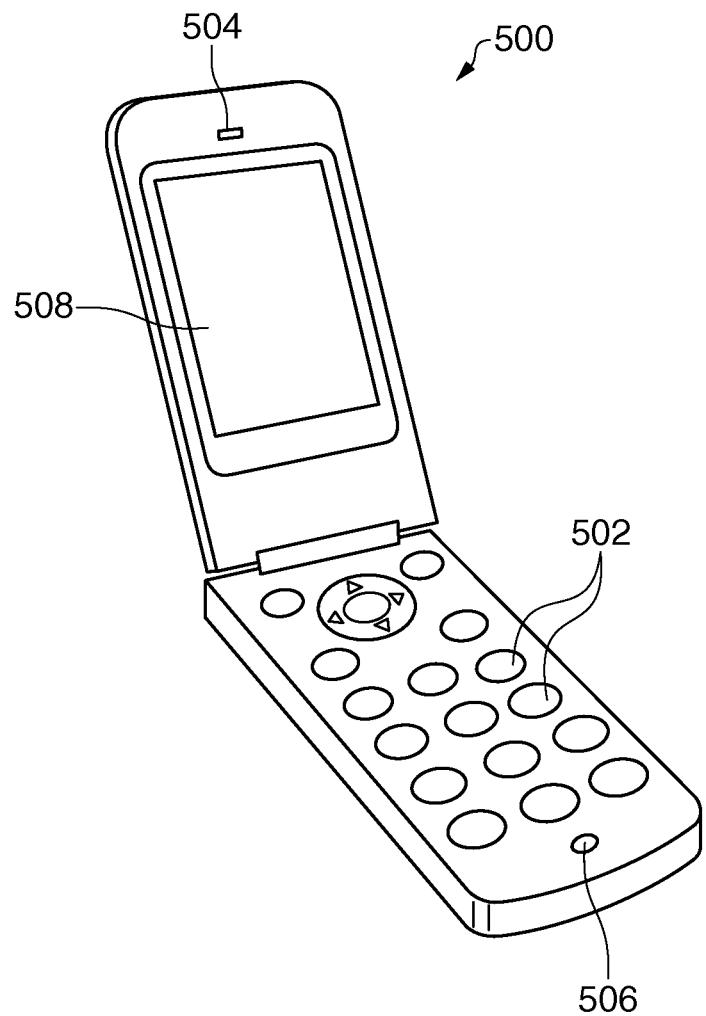
FIG. 18 is a schematic diagram of the electronic apparatus of the present embodiment.

FIG. 18 shows a schematic diagram of an electronic apparatus (mobile terminal) in which an atom oscillator is mounted as an example of the electronic apparatus of the present embodiment. In FIG. 18, a mobile terminal 500 (including a PHS and a smart phone) (an example of the electronic apparatus 400) includes a plurality of operating buttons 502 (an example of the operating unit 430), an earpiece 504, and a speaker 506, and a display unit 508 (an example of the display unit 470) is disposed between the operating buttons 502 and the earpiece 504. In recent years, the mobile terminal 500 has also come to have a GPS function. Therefore, in the mobile terminal 500, the atom oscillator of the present embodiment is built as a clock source of a GPS circuit.

As examples of the electronic apparatus of the present embodiment, various other electronic apparatuses can also be considered. For example, a personal computer (for example, a mobile personal computer, a laptop personal computer, and a tablet personal computer), a mobile terminal such as a mobile phone, a digital still camera, an inkjet type discharge apparatus (for example, an ink jet printer), a storage area network device such as a router and a switch, a local area network device, a television, a video camera, a video tape recorder, a car navigation system, a pager, an electronic diary (including an electronic diary with a communication function), an electronic dictionary, an electronic calculator, an electronic game machine, a controller for games, a word processor, a workstation, a video phone, a television monitor for security, electronic binoculars, a POS terminal, medical equipment (for example, an electronic thermometer, a sphygmomanometer, a blood glucose meter, and an electrocardiogram measuring device, an ultrasonic diagnostic apparatus, and an electronic endoscope), a fishfinder, various measuring apparatuses, instruments (for example, instruments in vehicles, aircrafts, and ships), a flight simulator, a head-mounted display, a motion tracer, a motion tracking device, a motion controller, a PDR (measurement of position and direction of pedestrian), and the like can be mentioned.

3. MODIFICATION EXAMPLES

The invention is not limited to the present embodiment, and can be modified within the scope of the invention.

Modification Example 1

In the flow chart shown in FIG. 12, it is possible to create the control information 332 by replacing the setting value of the heater current with the outside air temperature to acquire the detected value of the magnetic sensor 160 and the setting value of the coil current. Similarly, in the flow chart shown in FIG. 16, it is possible to create the control information 332 by replacing the setting value of the heater current with the outside air temperature to acquire the detected value of the current detection circuit 340 and the setting value of the coil current.

Modification Example 2

In the atom oscillator of the present embodiment, control may be performed by the first feedback loop such that the center wavelength $\lambda_0$ (center frequency $f_0$) of emitted light of the semiconductor laser 200 almost matches $\lambda_1$ or $\lambda_2$ (center frequency $f_0$ almost matches $f_1$ or $f_2$), where the wavelength $\lambda_1$ (frequency $f_1$) is equivalent to the energy difference between the excitation level and one ground level of the alkali metal atoms enclosed in the gas cell 110 and the wavelength $\lambda_2$ (frequency $f_2$) is equivalent to the energy difference between the excitation level and the other ground level. At the same time, by the second feedback loop, the frequency conversion circuit 290 may convert the output signal of the modulation circuit 270 into a signal having a frequency equal to the frequency equivalent to $\Delta E_{12}$.

Figure 19A:
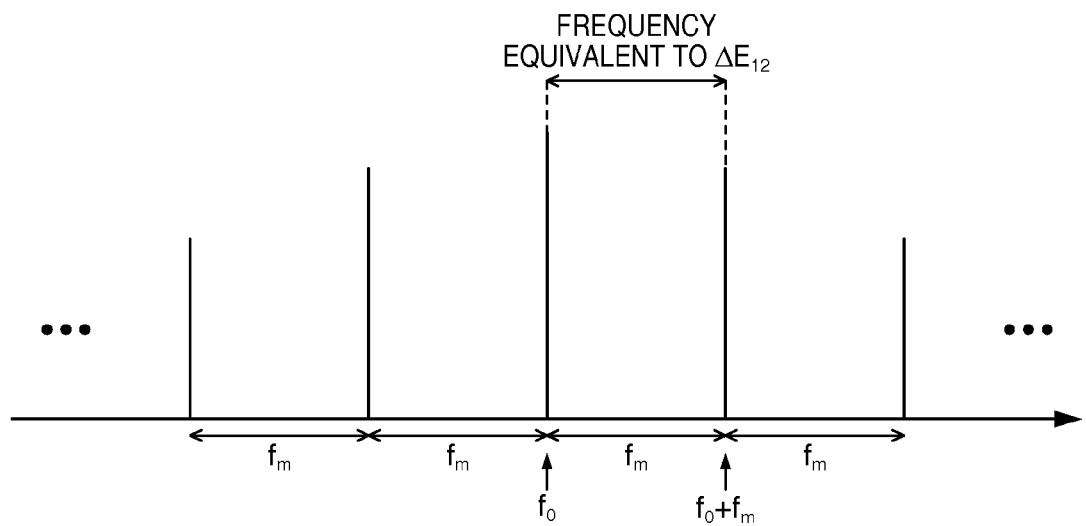
FIGS. 19A and 19B are schematic diagrams showing the frequency spectrum of emitted light of a semiconductor laser in a modification example.
Figure 19B:
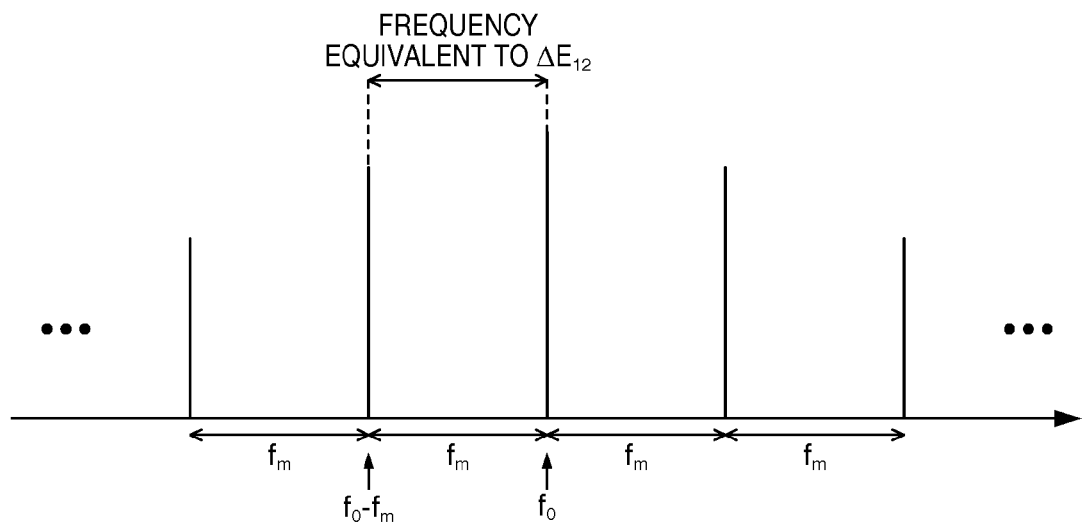
Figure 20:
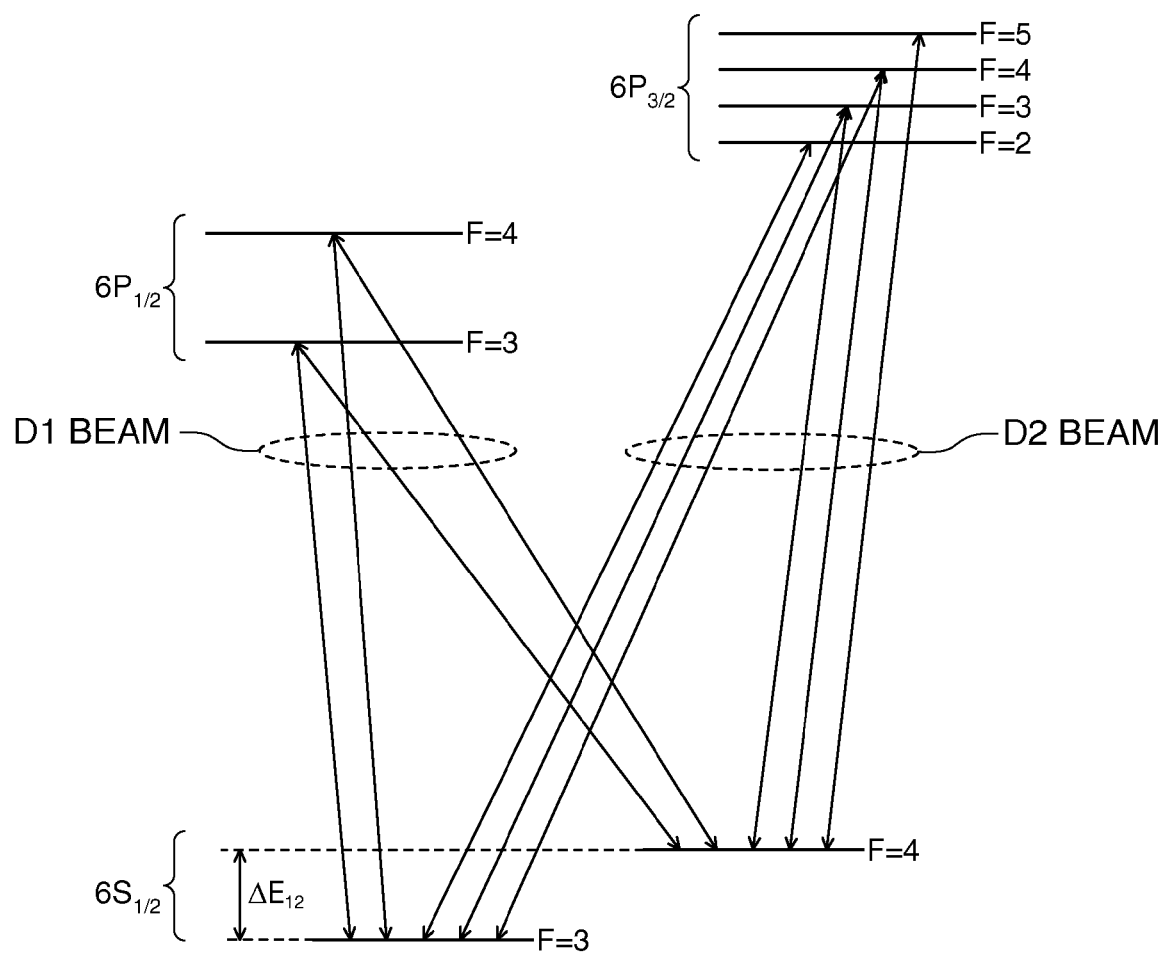
FIG. 20 is a diagram schematically showing the energy level of the cesium atom.
Figure 21:
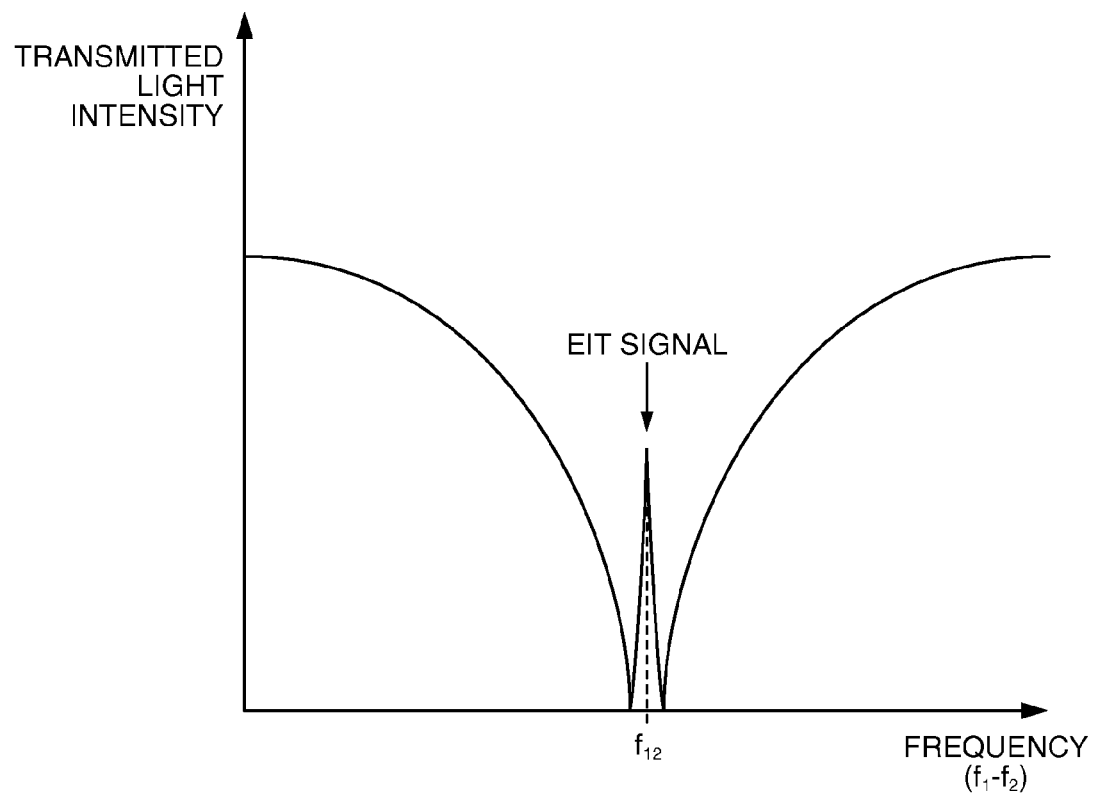
FIG. 21 is a schematic diagram showing an example of the EIT signal.
Figure 22A:
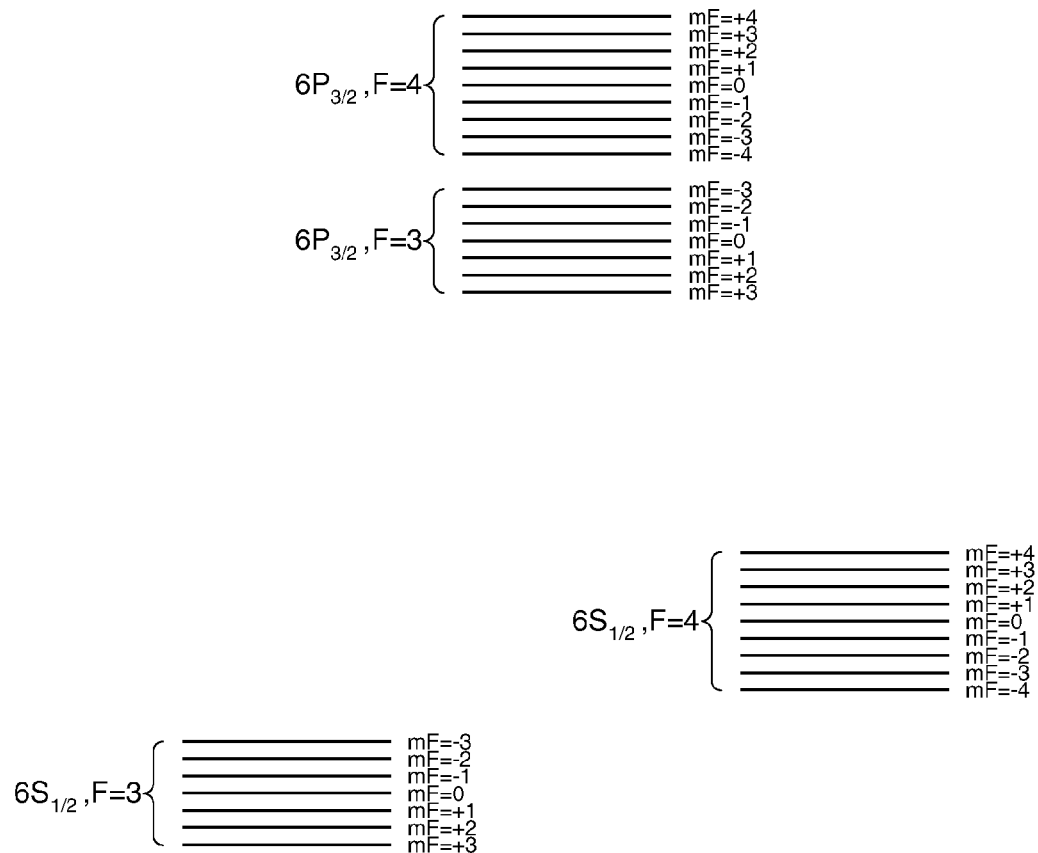
FIG. 22A is a diagram showing the energy level that undergoes Zeeman splitting.
Figure 22B:
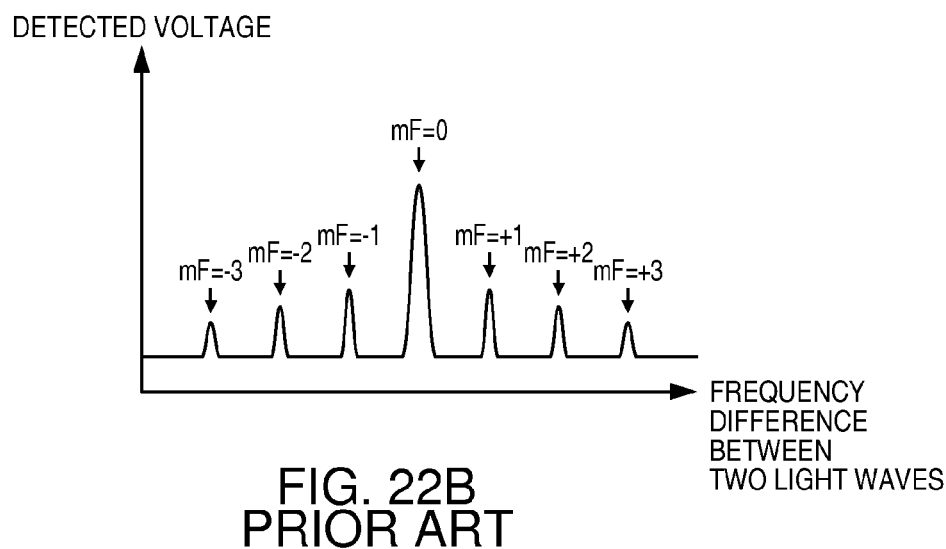
FIG. 22B is a diagram showing an example of the split EIT signal.
Figure 23:
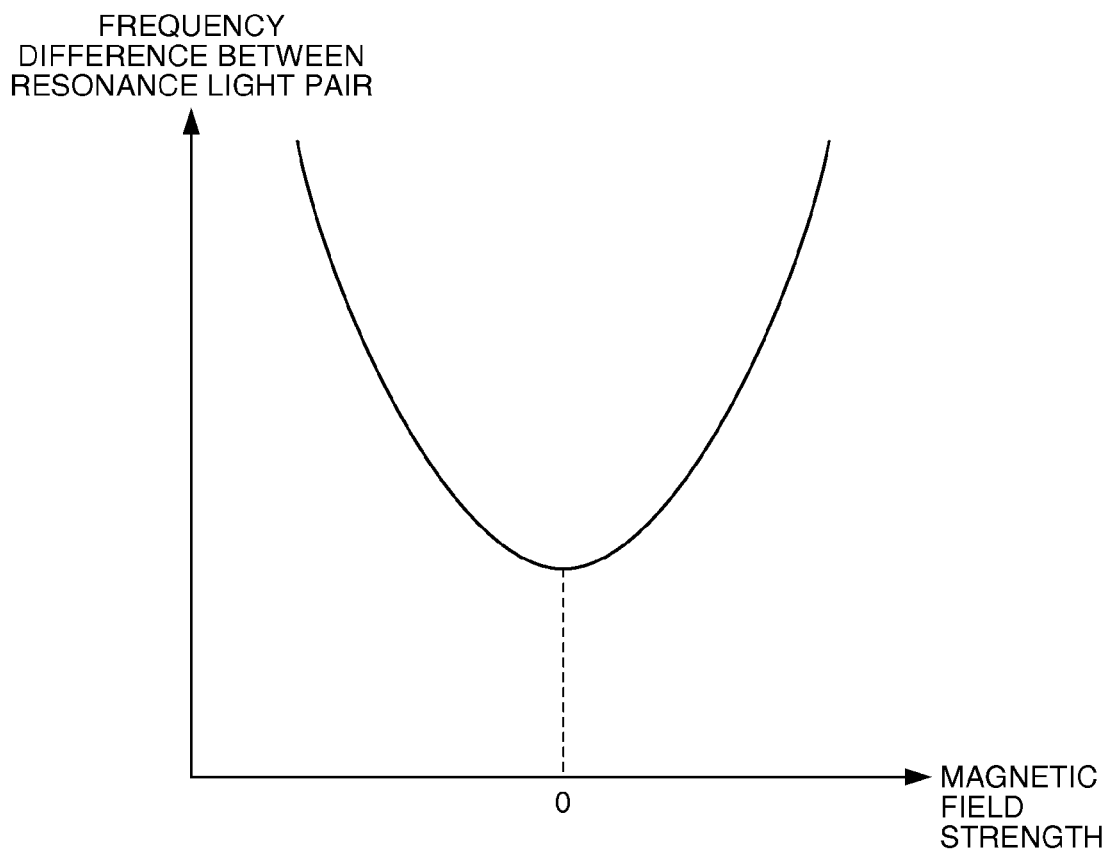
FIG. 23 is a diagram showing the relationship between the magnetic field strength and the frequency difference between the resonance light pair.

FIG. 19A is a schematic diagram showing a frequency spectrum of emitted light of the semiconductor laser 200 when the center wavelength $\lambda_0$ matches $\lambda_2$, and FIG. 19B is a schematic diagram showing a frequency spectrum of emitted light of the semiconductor laser 200 when the center wavelength $\lambda_0$ matches $\lambda_1$. In FIGS. 19A and 19B, the horizontal axis indicates a frequency of light, and the vertical axis indicates the intensity of light. In the case shown in FIG. 19A, since the frequency difference $f_m$ between the light having a frequency $f_0+f_m$ and the light having a frequency $f_0$ is equal to the frequency equivalent to $\Delta E_{12}$, $f_0+f_m$ is almost equal to $f_1$, and $f_0$ is almost equal to $f_2$, the light having a frequency $f_0+f_m$ and the light having a frequency $f_0$ become a resonance light pair causing the EIT phenomenon in the alkali metal atoms enclosed in the gas cell 110. On the other hand, in the case shown in FIG. 19B, since the frequency difference $f_m$ between the light having a frequency $f_0$ and the light having a frequency $f_0-f_m$ is almost equal to the frequency equivalent to $\Delta E_{12}$, $f_0$ is almost equal to $f_1$, and $f_0-f_m$ is almost equal to $f_2$, the light having a frequency $f_0$ and the light having a frequency $f_0-f_m$ become a resonance light pair causing the EIT phenomenon in the alkali metal atoms enclosed in the gas cell 110.

Modification Example 3

The configuration of the atom oscillator of the present embodiment may be changed to a configuration using an electro-optic modulator (EOM). That is, the semiconductor laser 200 generates light having a single frequency $f_0$ according to the set bias current without modulation based on the output signal (modulation signal) of the frequency conversion circuit 290. The light having a frequency $f_0$ is incident on the electro-optic modulator (EOM), and is modulated by the output signal (modulation signal) of the frequency conversion circuit 290. As a result, it is possible to generate light having the same frequency spectrum as in FIG. 4. Then, the light generated by the electro-optic modulator (EOM) is emitted to the gas cell 110. In this atom oscillator, the configuration including the semiconductor laser 200 and the electro-optic modulator (EOM) is equivalent to the light generator 20 shown in FIG. 1, 9, or 13.

In addition, an acousto-optic modulator (AOM) may be used instead of the electro-optic modulator (EOM).

4. APPLICATION EXAMPLES

The configuration of the atom oscillator of the present embodiment or each modification example can be applied to various quantum interference devices that cause a quantum interference state in the atom using resonance light.

Application Example 1

For example, if the magnetic shield 150 is eliminated from the atom oscillator of the present embodiment or each modification, the oscillation frequency of the voltage controlled crystal oscillator (VCXO) 260 is changed in response to the change in the magnetic field around the gas cell module 100. Therefore, a magnetic sensor (an example of the quantum interference device) can be realized by placing a magnetic measurement object in the vicinity of the gas cell module 100.

Application Example 2

In addition, for example, by the same configuration as in the atom oscillator of the present embodiment or each modification, it is possible to produce a quantum interference state (quantum coherence state) of the metal atom that is very stable. Therefore, a light source (an example of the quantum interference device) used in quantum information devices, such as a quantum computer, a quantum memory, and a quantum encryption system, can also be realized by taking out the resonance light pair incident on the gas cell 110.

The embodiments and the modification examples described above are just examples, and the invention is not limited to these. For example, each embodiment and each modification example can be appropriately combined.

The invention includes substantially the same configuration (for example, a configuration with the same function, method, and result or a configuration with the same object and effect) as the configuration described in each embodiment. In addition, the invention includes a configuration that replaces a unit that is not essential in the configuration described in the embodiment. In addition, the invention includes a configuration capable of achieving the same operations and effects as in the configuration described in each embodiment or a configuration capable of achieving the same object. In addition, the invention includes a configuration obtained by adding a known technique to the configuration described in the embodiment.

The entire disclosure of Japanese Patent Application No. 2012-198264, filed Sep. 10, 2012 is expressly incorporated by reference herein.

What is claimed is:

1. An atom cell module, comprising:
   an atom cell in which atoms are enclosed;
   a heating unit that heats the atom cell by generating heat when a current flows;
   a magnetic detector that detects a strength of a first magnetic field generated by the current flowing through the heating unit and that generates a detection signal corresponding to the strength of the first magnetic field;
   a magnetic field generator that generates a second magnetic field; and
   a magnetic field control unit that controls the second magnetic field generated by the magnetic field generator, wherein
   inside the atom cell, the second magnetic field generated by the magnetic field generator and the first magnetic field generated by the current flowing through the heating unit include magnetic field components in opposite directions, and
   the magnetic field control unit is configured to control the second magnetic field generated by the magnetic field generator according to the detection signal of the magnetic detector.

2. The atom cell module according to claim 1,
   wherein the magnetic field generator generates the second magnetic field inside the atom cell when at least a part of the current flowing through the heating unit flows.

3. The atom cell module according to claim 1, further comprising:
a magnetic shielding unit that shields the atom cell, the heating unit, and the magnetic field generator from an external magnetic field.

4. A quantum interference device, comprising:
the atom cell module according to claim 1;
a light generator that generates light including a resonance light pair and emits the light to the atom cell;
a light detector that detects light transmitted through the atom cell; and
a control unit that controls a frequency of the resonance light pair on the basis of a light detection signal of the light detector.

5. The quantum interference device according to claim 4, further comprising:
the magnetic field control unit that controls the second magnetic field generated by the magnetic field generator so as to reduce a variation of a magnetic field inside the atom cell.

6. The quantum interference device according to claim 5, wherein the magnetic detector is adjacent to the heating unit.

7. An electronic apparatus, comprising:
the quantum interference device according to claim 6.

8. An electronic apparatus, comprising:
the quantum interference device according to claim 5.

9. An electronic apparatus, comprising:
the quantum interference device according to claim 4.

10. An atom cell magnetic field control method to control a magnetic field inside an atom cell in which atoms are enclosed, comprising:
detecting a strength of a first magnetic field generated by a current flowing through a heating unit and generating a detection signal corresponding to the strength of the first magnetic field; and
generating a second magnetic field by a magnetic field generator, wherein
inside the atom cell, the second magnetic field and the first magnetic field include magnetic field components in opposite directions, and
controlling the second magnetic field generated by the magnetic field generator according to the detection signal.

11. An atom cell module, comprising:
an atom cell in which atoms are enclosed;
a heating unit that heats the atom cell by generating heat when a current flows;
a current detector that detects the current flowing through the heating unit and that generates a detection signal;
a magnetic field generator that generates a first magnetic field; and
a magnetic field control unit that controls the first magnetic field generated by the magnetic field generator, wherein
inside the atom cell, the first magnetic field generated by the magnetic field generator and a second magnetic field generated by the current flowing through the heating unit include magnetic field components in opposite directions, and
the magnetic field control unit is configured to control the first magnetic field generated by the magnetic field generator according to the detection signal of the current detector.

12. The atom cell module according to claim 11, wherein the magnetic field generator generates the first magnetic field inside the atom cell when at least a part of the current flowing through the heating unit flows.

13. The atom cell module according to claim 11, further comprising:
a magnetic shielding unit that shields the atom cell, the heating unit, and the magnetic field generator from an external magnetic field.

14. A quantum interference device, comprising:
the atom cell module according to claim 11;
a light generator that generates light including a resonance light pair and emits the light to the atom cell;
a light detector that detects light transmitted through the atom cell; and
a control unit that controls a frequency of the resonance light pair on the basis of a detection signal of the light detector.

15. The quantum interference device according to claim 14, further comprising:
the magnetic field control unit that controls the first magnetic field generated by the magnetic field generator so as to reduce a variation of a magnetic field inside the atom cell.

16. An electronic apparatus, comprising:
the quantum interference device according to claim 15.

* * * * *